US010784340B2

(12) United States Patent
Siddiqui et al.

(10) Patent No.: US 10,784,340 B2
(45) Date of Patent: Sep. 22, 2020

(54) SEMICONDUCTOR DEVICE HAVING A SUPER-JUNCTION IN THE DRIFT REGION WITH DECREASING DOPED SUB-REGIONS WIDTHS

(71) Applicant: Nuvoton Technology Corporation, Hsinchu Science Park (TW)

(72) Inventors: MD Imran Siddiqui, Jharkhand (IN); Po-An Chen, Toufen (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/235,145

(22) Filed: Dec. 28, 2018

(65) Prior Publication Data

US 2019/0206989 A1 Jul. 4, 2019

(30) Foreign Application Priority Data

Dec. 29, 2017 (TW) .............................. 106146498 A

(51) Int. Cl.
*H01L 29/06* (2006.01)
*H01L 29/78* (2006.01)
(Continued)

(52) U.S. Cl.
CPC ........ *H01L 29/0634* (2013.01); *H01L 21/266* (2013.01); *H01L 21/26513* (2013.01);
(Continued)

(58) Field of Classification Search
CPC ... H01L 29/7816–7826; H01L 29/7835; H01L 29/66681–66704; H01L 29/66659;
(Continued)

(56) References Cited

U.S. PATENT DOCUMENTS 5,426,325 A 6/1995 Chang et al.
6,297,534 B1 * 10/2001 Kawaguchi ......... H01L 29/0634
257/341
(Continued)

FOREIGN PATENT DOCUMENTS

CN 101826554 A 9/2010
CN 103268886 B 6/2015
(Continued)

OTHER PUBLICATIONS

Office Action of the corresponding TW patent application No. 105144152 dated Apr. 25, 2017; pp. 1-7.
(Continued)

*Primary Examiner* — Younes Boulghassoul
(74) *Attorney, Agent, or Firm* — Muncy, Geissler, Olds & Lowe, P.C.

(57) ABSTRACT

A semiconductor device is disclosed. The semiconductor device includes a substrate structure, a gate structure, a drift region, a drain region in the substrate structure, two isolation structures at opposite sides of the drift region, wherein the drift region has a first width, the isolation structure has a second width, a ratio of the first width to the second width is in a range from 1 to 4. The semiconductor device further includes a super-junction doped structure in the drift region and including a plurality of first-conductive-type doped sub-regions and a plurality of second-conductive-type doped sub-regions which are alternately disposed. Widths of the plurality of first-conductive-type doped sub-regions decrease from the gate structure to the drain region, and widths of the plurality of second-conductive-type doped sub-regions also decrease from the gate structure to the drain region.

10 Claims, 10 Drawing Sheets

(51) Int. Cl.
  *H01L 29/10* (2006.01)
  *H01L 29/66* (2006.01)
  *H01L 21/265* (2006.01)
  *H01L 21/266* (2006.01)

(52) U.S. Cl.
  CPC ...... *H01L 29/0653* (2013.01); *H01L 29/1095* (2013.01); *H01L 29/66681* (2013.01); *H01L 29/7816* (2013.01)

(58) Field of Classification Search
  CPC ..... H01L 29/063–0634; H01L 29/0615–0634; H01L 29/0873–0886; H01L 29/0847; H01L 29/0653
  See application file for complete search history.

(56) References Cited

U.S. PATENT DOCUMENTS

| | | | |
|---|---|---|---|
| 6,528,849 B1* | 3/2003 | Khemka | H01L 29/7816 257/342 |
| 7,023,050 B2 | 4/2006 | Salama et al. | |
| 8,159,029 B2 | 4/2012 | Su et al. | |
| 8,592,901 B1 | 11/2013 | Sheu et al. | |
| 8,598,658 B2 | 12/2013 | Fang et al. | |
| 9,082,841 B1 | 7/2015 | Chang et al. | |
| 2003/0132459 A1* | 7/2003 | Lee | H01L 29/0634 257/213 |
| 2003/0193067 A1* | 10/2003 | Kim | H01L 29/0634 257/343 |
| 2004/0217377 A1* | 11/2004 | Deboy | H01L 29/861 257/197 |
| 2004/0222461 A1* | 11/2004 | Peyre-Lavigne | H01L 29/7816 257/333 |
| 2004/0232483 A1* | 11/2004 | Kitagawa | H01L 29/7824 257/335 |
| 2005/0017300 A1* | 1/2005 | Salama | H01L 29/7816 257/342 |
| 2007/0120187 A1* | 5/2007 | Udrea | H01L 29/0692 257/347 |
| 2007/0272979 A1 | 11/2007 | Saito et al. | |
| 2011/0233714 A1 | 9/2011 | Lu | |
| 2012/0058608 A1* | 3/2012 | Cheng | H01L 29/66681 438/163 |
| 2012/0086052 A1 | 4/2012 | Chen et al. | |
| 2012/0126323 A1* | 5/2012 | Wu | H01L 29/7816 257/343 |
| 2012/0217579 A1* | 8/2012 | Huang | H01L 29/0634 257/335 |
| 2012/0241861 A1 | 9/2012 | Chen et al. | |
| 2013/0020680 A1 | 1/2013 | Chen et al. | |
| 2013/0082326 A1* | 4/2013 | Tang | H01L 29/0634 257/335 |
| 2013/0341718 A1 | 12/2013 | Kim et al. | |
| 2014/0027811 A1 | 1/2014 | Chen et al. | |
| 2014/0048880 A1 | 2/2014 | Tsuchiko | |
| 2014/0061788 A1 | 3/2014 | Chen et al. | |
| 2014/0103430 A1* | 4/2014 | Yoshino | H01L 29/7816 257/335 |
| 2014/0353678 A1 | 12/2014 | Kawakami et al. | |
| 2015/0048449 A1 | 2/2015 | Jeon et al. | |
| 2015/0221721 A1 | 8/2015 | Kawakami et al. | |
| 2015/0243766 A1* | 8/2015 | Tu | H01L 29/0653 257/329 |
| 2015/0295027 A1* | 10/2015 | Chang | H01L 29/66659 257/339 |
| 2016/0172436 A1 | 6/2016 | Ho et al. | |
| 2016/0211365 A1* | 7/2016 | Shea | H01L 29/66659 |
| 2016/0254375 A1 | 9/2016 | Nakamura | |
| 2017/0054018 A1* | 2/2017 | Zhang | H01L 29/7835 |
| 2017/0200784 A1 | 7/2017 | Shirakawa et al. | |
| 2017/0365595 A1 | 12/2017 | He et al. | |
| 2018/0033854 A1 | 2/2018 | Kaya et al. | |
| 2020/0006499 A1* | 1/2020 | Darwish | H01L 29/7835 |

FOREIGN PATENT DOCUMENTS

| | | |
|---|---|---|
| CN | 106206425 A | 12/2016 |
| TW | 201225292 A | 6/2012 |
| TW | I467766 B | 1/2015 |
| TW | I527098 B | 3/2016 |

OTHER PUBLICATIONS

Office Action of its related TW patent application No. 105144153 dated May 12, 2017; pp. 1-3.

Office Action of its corresponding TW patent application No. 106146498 dated Apr. 25, 2018; pp. 1-9.

J. Sonsky and A. Heringa, "Dielectric resurf: breakdown voltage control by STI layout in standard CMOS," IEEE International Electron Devices Meeting, 2005. IEDM Technical Digest., Washington, DC, 2005, pp. 4-376.

A. Kumar et al., "Design of a low on resistance high voltage (<100V) novel 3D NLDMOS with side STI and single P-top layer based on 0.18um BCD process technology," 2013 IEEE 8th Nanotechnology Materials and Devices Conference (NMDC), Tainan, Oct. 7, 2013, pp. 78-80.

U.S. Office Action in U.S. Appl. No. 15/859,042 dated Jul. 19, 2018; pp. 1-22.

U.S. Office Action in U.S. Appl. No. 15/858,792 dated Oct. 5, 2018; pp. 1-21.

U.S. Office Action dated May 1, 2019 in U.S. Appl. No. 15/858,792 (13 pages).

U.S. Office Action dated Jun. 12, 2019 in U.S. Appl. No. 15/859,042 (11 pages).

* cited by examiner

SEMICONDUCTOR DEVICE HAVING A SUPER-JUNCTION IN THE DRIFT REGION WITH DECREASING DOPED SUB-REGIONS WIDTHS

CROSS REFERENCE TO RELATED APPLICATIONS

This Application claims priority of Taiwan Patent Application No. 106146498, filed on Dec. 29, 2017, the entirety of which is incorporated by reference herein.

BACKGROUND

Technical Field

The present disclosure relates to a semiconductor device, and in particular to a semiconductor device with super junction doped structure.

Description of the Related Art

Power management integrated circuits (PMIC) have been widely applied in the fields of light-emitting diodes (LEDs), display driver integrated circuit devices, power supplies, power management integrated circuit (PMIC) devices, communication devices and power control systems for mobile electronics due to their advantages of cost-effectiveness and easy integration with other processes. However, it is hard to improve upon conventional power management integrated circuits due to problems such as the latch-up effect, low punch-through voltage, low switching speed, and a large device area.

Thus, a high-voltage semiconductor device is needed in order to improve the high-voltage semiconductor device, such as reducing the on-resistance of the high-voltage semiconductor device.

SUMMARY

Exemplary embodiments of a semiconductor device are provided. The semiconductor device includes a substrate structure, a bulk region in the substrate structure and having a first conductive type, a gate structure on the substrate structure and having a first side and a second side opposite to the first side, a drift region in the substrate structure at the first side of the gate structure and having a third side and a fourth side opposite to the third side, and a source region in the bulk region at the second side of the gate structure. The semiconductor device further includes a drain region in the substrate structure at the first side of the gate structure and having a second conductive type, wherein the first conductive type is different from the second conductive type, wherein a connect direction between the gate structure and the drain region is a first direction and a connect direction between the third side and the fourth side of the drift region is a second direction, wherein the first direction is perpendicular to the second direction. The semiconductor device further includes two isolation structures at the third side and the fourth side of the drift region respectively, wherein the drift region has a first width along the second direction, wherein one of the isolation structures has a second width along the second direction, wherein a ratio of the first width to the second width is in a range from 1 to 4. The semiconductor device further includes a super-junction doped structure in the drift region, and between the gate structure and the drain region, comprises a plurality of first-conductive-type doped sub-regions extending along a third direction, disposed along the first direction and having the first conductive type, and a plurality of second-conductive-type doped sub-regions extending along the third direction, disposed along the first direction and having the second conductive type, wherein the plurality of first-conductive-type doped sub-regions and the plurality of second conductive doped sub-regions are alternately disposed, wherein widths of the plurality of first-conductive-type doped sub regions along the first direction decrease from the gate structure to the drain region, wherein widths of the plurality of second-conductive-type doped sub-regions along the first direction decrease from the gate structure to the drain region.

Another exemplary embodiment of a semiconductor device is provided. The semiconductor device includes a substrate structure, a bulk region in the substrate structure and having a first conductive type, a gate structure on the substrate structure and having a first side and a second side opposite to the first side, a drift region in the substrate structure at the first side of the gate structure and having a third side and a fourth side opposite to the third side, and a source region in the bulk region at the second side of the gate structure. The semiconductor device further includes a drain region in the substrate structure at the first side of the gate structure and having a second conductive type, wherein the first conductive type is different from the second conductive type, wherein a connect direction between the gate structure and the drain region is a first direction and a connect direction between the third side and the fourth side of the drift region is a second direction, wherein the first direction is perpendicular to the second direction. The semiconductor device further includes two isolation structures at the third side and the fourth side of the drift region respectively, wherein the drift region has a first width along the second direction, wherein one of the isolation structures has a second width along the second direction, wherein a ratio of the first width to the second width is in a range from 1 to 4. The semiconductor device further includes a super-junction doped structure array in the drift region, and between the gate structure and the drain region, comprises a first super-junction doped structure row and a second super-junction doped structure row adjacent to each other, wherein each of the first super-junction doped structure row and the second super-junction doped structure row independently comprises a plurality of first-conductive-type doped sub-regions extending along a third direction, disposed along the first direction and having the first conductive type, and a plurality of second-conductive-type doped sub-regions extending along the third direction, disposed along the first direction and having the second conductive type, wherein the plurality of first-conductive-type doped sub-regions and the plurality of second-conductive-type doped sub-regions are alternately disposed, wherein the first-conductive-type doped sub-region of the first super-junction doped structure row contacts the second-conductive-type doped sub-region of the second super-junction doped structure row, wherein the second-conductive-type doped sub-region of the first super-junction doped structure row contacts the first-conductive-type doped sub-region of the second super junction doped structure row.

BRIEF DESCRIPTION OF THE DRAWINGS

In order to make the features and advantages of some embodiments of the present disclosure more obvious and understandable, a detailed description is given in the following embodiments with reference to the accompanying drawings.

DETAILED DESCRIPTION

Figure 1A:
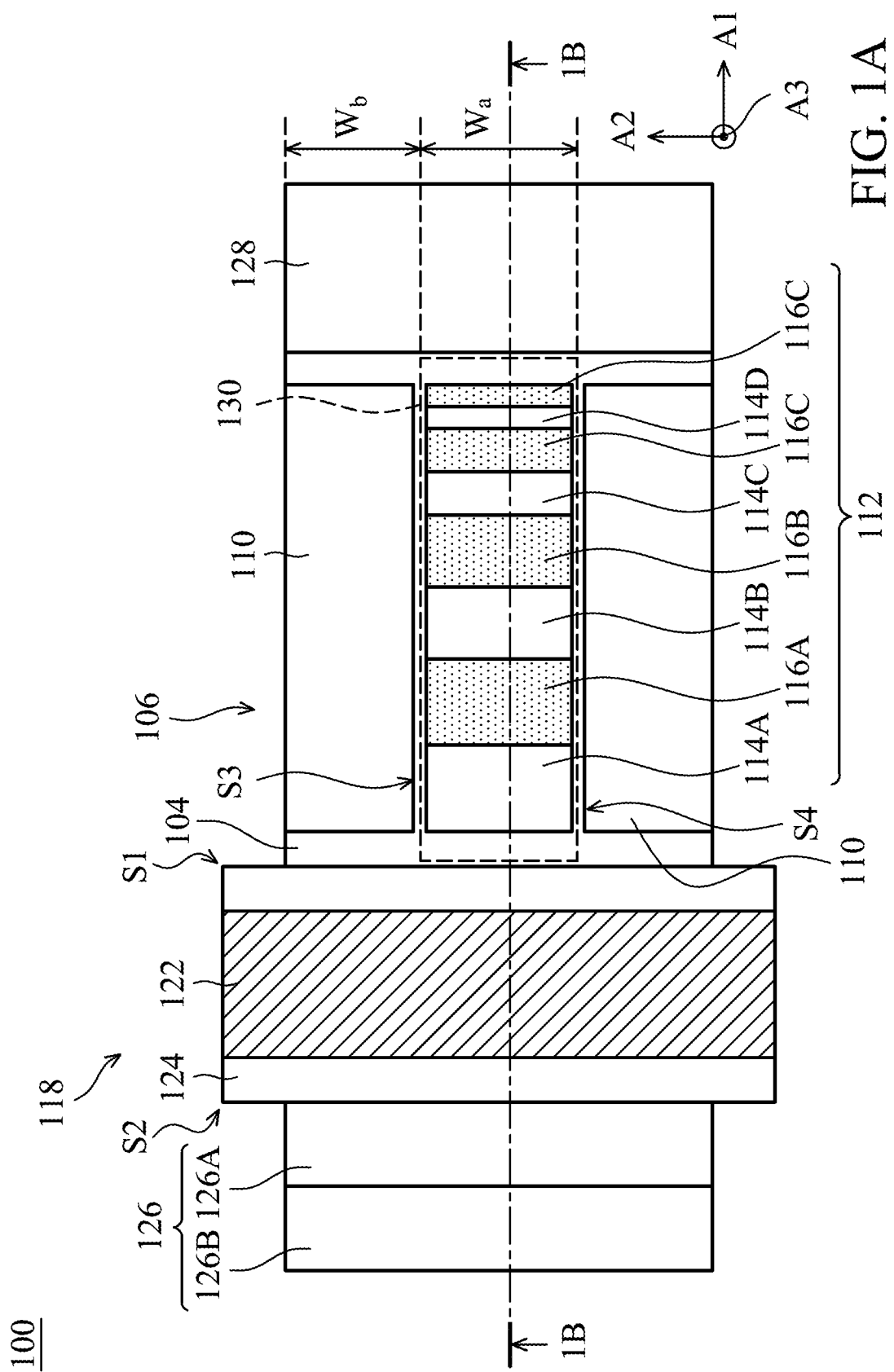
FIG. 1A is a top view of a semiconductor device in accordance with some embodiments of the disclosure.

The semiconductor device of the present disclosure is described in detail in the following description. The following disclosure provides many different embodiments, or examples, for implementing different features of the present disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "approximately" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "approximately".

The terms "substantially" and "essentially" generally mean within 90% of a stated value or range, more typically 95% of the stated value, more typically 98% of the stated value and even more typically 99% of the stated value.

It should be understood that, although the terms first, second, third etc. may be used herein to describe various elements, components, regions, layers and/or portions, these elements, components, regions, layers and/or portions should not be limited by these terms. These tennis are only used to distinguish one element, component, region, layer or portion from another element, component, region, layer or portion. Thus, a first element, component, region, layer or portion discussed below could be termed a second element, component, region, layer or portion without departing from the teachings of the present disclosure.

Unless defined otherwise, all technical and scientific terms used herein have the same meaning as commonly understood by one of ordinary skill in the art to which this disclosure belongs. It should be appreciated that, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. It should be understood that the drawings are not drawn to scale. The shapes and thicknesses of the embodiments may be exaggerated in the drawings in order to clearly illustrate the features of some embodiments of the present disclosure. In addition, structures and devices are shown schematically in order to simplify the drawing.

In the description, relative terms such as "lower," "upper," "horizontal," "vertical,", "above," "below," "up," "down," "top" and "bottom" should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should be noted that the term "substrate" is meant to include devices formed within a semiconductor wafer and the layers overlying the wafer. All semiconductor element needed may be already formed over the substrate. However, the substrate is represented with a flat surface in order to simplify the drawing. The term "substrate surface" is meant to include the uppermost exposed layers on a semiconductor wafer, such as silicon surface, and insulating layer and/or metallurgy lines.

Some embodiments of the present disclosure utilize isolation structures and a drift region having a particular width ratio to reduce the on-resistance of the semiconductor device. In addition, in some embodiments of the present disclosure, the on-resistance of the semiconductor device can be reduced further with a super-junction doped structure having a specific configuration and a specific width, depth, and/or dopant concentration variation. Alternately, in some embodiments of the present disclosure, the on-resistance of the semiconductor device can be reduced further with a super-junction doped structure array having a specific configuration.

Figure 1B:
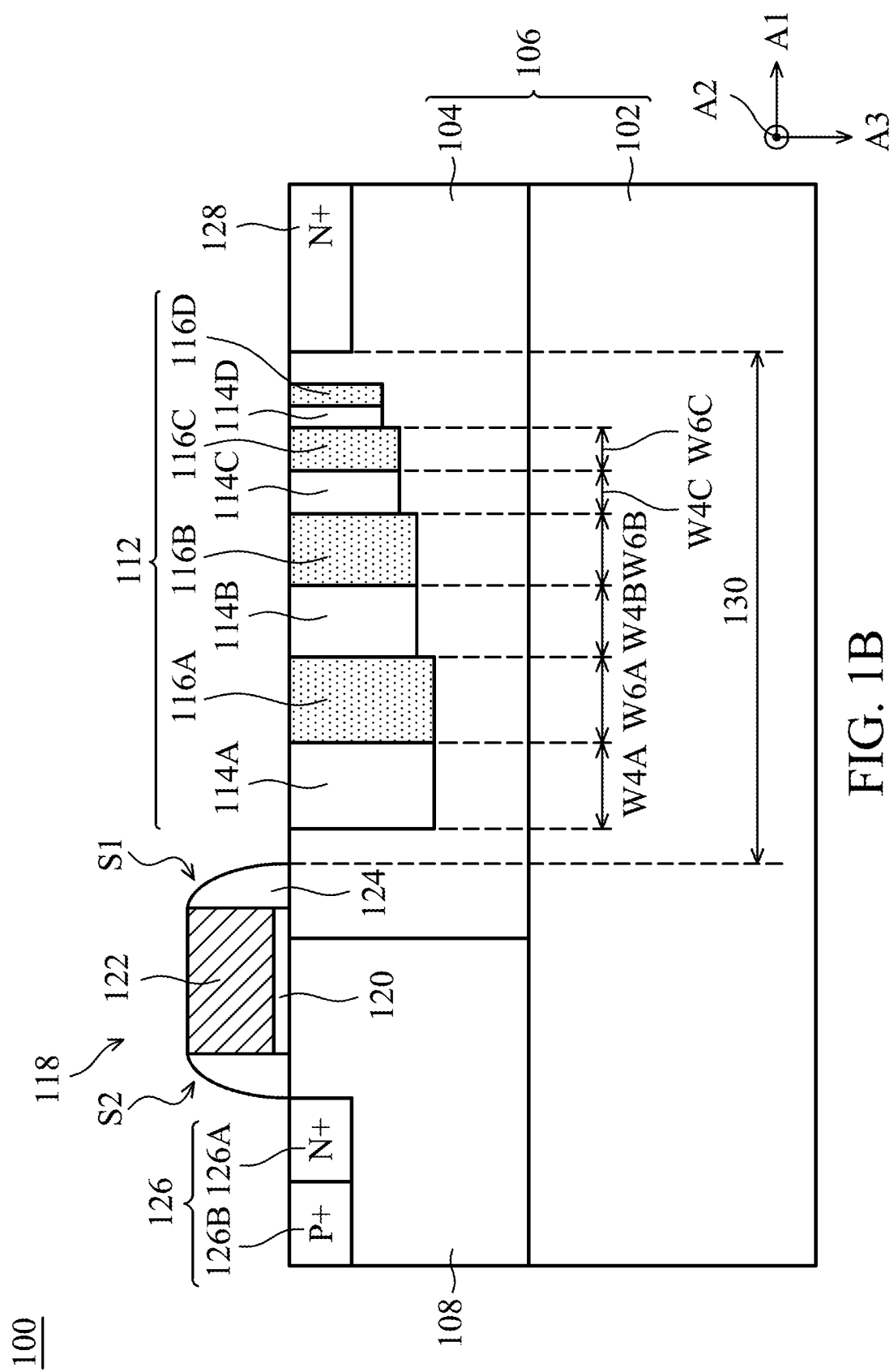
FIG. 1B is a cross-sectional view along line 1B-1B in FIG. 1A.

First, referring to FIGS. 1A-1B, FIG. 1A is a top view of a semiconductor device in accordance with some embodiments of the present disclosure. FIG. 1B is a cross-sectional view along line 1B-1B in FIG. 1A. As shown in FIGS. 1A-1B, according to some embodiments of the present disclosure, a semiconductor substrate 102 is provided. The semiconductor substrate 102 may be a silicon substrate. In addition, the semiconductor substrate may also be an elemental semiconductor, including germanium; a compound semiconductor including gallium nitride (GaN), silicon carbide, gallium arsenide, gallium phosphide, indium phosphide, indium arsenide and/or indium antimonide; an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP) or a combination thereof. Furthermore, the semiconductor substrate 102 may also be a semiconductor on insulator.

In some embodiments, the semiconductor substrate 102 may have a first conductive type. For example, in some embodiments of the present disclosure, the semiconductor substrate 102 is a P-type semiconductor substrate.

Next, an epitaxial layer 104 is formed on the semiconductor substrate 102. The epitaxial layer 104 may include silicon, germanium, silicon and germanium, a III-V compound, or a combination thereof. The epitaxial layer 104 can be formed by an epitaxial growth process, such as metal organic chemical vapor deposition (MOCVD), metal organic vapor phase epitaxy (MOVPE), plasma enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride VPE (Cl-VPE), or the like.

The epitaxial layer 104 has a second conductive type. For example, when the second conductive type is N-type, the epitaxial layer 104 is an N-type epitaxial layer, which can be in-situ doped by adding phosphine or arsine to the reaction gas when depositing the epitaxial layer 104, or an undoped epitaxial layer 104 may be deposited first, followed by ion implantation with phosphorus or arsenic ions. In some embodiments of the present disclosure, the first conductive type is different from the second conductive type.

In some other embodiments of the present disclosure, when the second conductive type is P-type, the epitaxial layer 104 is a P-type epitaxial layer, which may be in-situ doped by adding borane ($BH_3$) or boron tribromide ($BBr_3$) to the reaction gas when depositing the epitaxial layer 104, or the undoped epitaxial layer 104 may be deposited first, followed by ion implantation with boron ions or indium ions.

In some embodiments of the present disclosure, the semiconductor substrate 102 and the epitaxial layer 104 are in combination referred to as a substrate structure 106.

Still referring to FIGS. 1A-1B, according to some embodiments of the present disclosure, a bulk region 108 is formed in epitaxial layer 104. In some embodiments of the present disclosure, the bulk region 108 has a first conductive type.

The bulk region 108 may be formed by ion implantation. For example, when the first conductive type is P-type, boron ions, indium ions, or boron difluoride ions ($BF_2^+$) may be implanted in a region where the bulk region 108 is to be formed to form the bulk region 108. Alternately, in some other embodiments of the present disclosure, when the first conductive type is N-type, phosphorous or arsenic ions may be implanted in a region where the bulk region 108 is to be formed to form the bulk region 108.

Still referring to FIG. 1A, according to some embodiments of the present disclosure, at least two isolation structures 110 are formed in the substrate structure 106. In some embodiments, the isolation structure 110 may be shallow trench isolation.

In some embodiments of the present disclosure, the isolation structure 110 may be formed by the following process steps. First, a trench is formed in a region where the isolation structure 110 is to be formed. In some embodiments, the trench may be formed by an etching step. The etching step includes dry etching, wet etching, or a combination thereof. The wet etch may include immersion etching, spray etching, a combination thereof, or other suitable wet etching. The dry etching step may include a capacitively coupled plasma (CCP) etching process, an inductively coupled plasma (ICP) etching process, a helicon wave plasma etching process, an electron cyclotron resonance (ECR) plasma etching process, a combination thereof, or other suitable dry etching process. The gases used in the dry etching process may include inert gases, fluorine-containing gases, chlorine-containing gases, bromide-containing gases, iodide-containing gases, a combination thereof, or other suitable gases. In some embodiments, gases used in the dry etching process may include Ar, $CF_4$, $SF_6$, $CH_2F_2$, $CHF_3$, $C_2F_6$, $Cl_2$, $CHCl_3$, $CCl_4$, HBr, $CHBr_3$, $BF_3$, $BCl_3$, a combination thereof, or another suitable gas.

Next, an insulating material is filled in the trench to form the isolation structure 110. In some embodiments, the insulating material may fill the trench. The insulating material may be silicon oxide, silicon nitride, silicon oxynitride, another suitable isolation material, or a combination thereof, formed by a chemical vapor deposition method. The chemical vapor deposition method may be, for example, low pressure chemical vapor deposition (LPCVD), low temperature chemical vapor deposition (LTCVD), or rapid temperature chemical vapor deposition (RTCVD), plasma enhanced chemical vapor deposition (PECVD), atomic layer deposition (ALD) of atomic layer chemical vapor deposition or other commonly used methods.

Still referring to FIGS. 1A-1B, according to some embodiments of the present disclosure, a super-junction doped structure 112 is formed in a region of the epitaxial layer 104 where the bulk region 108 is not formed. As shown in FIGS. 1A-1B, according to some embodiments of the present disclosure, the super-junction doped structure 112 at least includes one or more first-conductive-type doped sub-regions and one or more second-conductive-type doped sub-regions, for example, the first-conductive-type doped sub-regions 114A, 114B, 114C, and 114D and the second-conductive-type doped sub-regions 116A, 116B, 116C, and 116D.

In some embodiments of the present disclosure, a first direction A1 is parallel to the connect direction of the subsequently formed gate structure and drain region, and a third direction A3 is parallel to a normal direction of a top surface of the substrate structure 106. As shown in FIGS. 1A-1B, according to some embodiments of the present disclosure, the third direction A3 is perpendicular to the first direction A1.

As shown in FIGS. 1A-1B, according to some embodiments of the present disclosure, the plurality of first-conductive-type doped sub-regions 114A, 114B, 1140, and 114D extend along the third direction A3, and the plurality of first-conductive-type doped sub-regions 114A, 114B, 114C, and 114D are sequentially disposed along the first direction A1. In some embodiments of the present disclosure, the first-conductive-type doped sub-regions 114A, 114B, 114C, and 114D have the first conductive type.

As shown in FIGS. 1A-1B, according to some embodiments of the present disclosure, the plurality of second-conductive-type doped sub-regions 116A, 116B, 116C, and 116D extend along the third direction A3, and the plurality of second-conductive-type doped sub-regions 116A, 116B, 116C, and 116D are sequentially disposed along the first direction A1. In some embodiments of the present disclosure, the second-conductive-type doped sub-regions 116A, 116B, 116C, and 116D have the second conductive type.

Still referring to FIGS. 1A-1B according to some embodiments of the present disclosure, the plurality of first-conductive-type doped sub-regions 114A, 114B, 114C and 114D and the plurality of second-conductive-type doped sub-regions 116A, 116B, 116C, and 116D are alternately disposed along the first direction A1.

In some embodiments of the present disclosure, the super-junction doped structure 112 can be formed in the implantation steps of FIGS. 2A-2B, which will be described in detail later.

Still referring to FIGS. 1A-1B, according to some embodiments of the present disclosure, the gate structure 118 is formed on the substrate structure 106 and has a first side S1 and a second side S2 opposite to the first side S1. The gate structure 118 includes a gate dielectric layer 120 and a gate electrode 122.

As shown in FIGS. 1A-1B, according to some embodiments of the present disclosure, the gate dielectric layer 120 is formed on the substrate structure 106 and the gate electrode 122 is formed on the gate dielectric layer 120. In some embodiments, a dielectric material layer (not shown) and a conductive material layer (not shown) may be blanketly deposited on the substrate structure 106 sequentially, and then the dielectric material layer and the conductive material layer are further patterned respectively by the lithography and etching processes to form the gate dielectric layer 120 and the gate electrode 122.

The dielectric material layer (used to form the gate dielectric layer 120) may include silicon oxide, silicon nitride, silicon oxynitride, high-k dielectric material, any other suitable dielectric material, or a combination thereof. The high-k dielectric material may include metal oxide, metal nitride, metal silicide, transition metal oxide, transition metal nitride, transition metal silicide, metal oxynitride, metal aluminate, zirconium silicate, or zirconium aluminate. For example, the material of the high-k dielectric material may include LaO, AlO, ZrO, TiO, $Ta_2O_5$, $Y_2O_3$, $SrTiO_3$ (STO), $BaTiO_3$ (BTO), BaZrO, $HfO_2$, $HfO_3$, HfZrO, HfLaO, HfSiO, HfSiON, LaSiO, AlSiO, HfTaO, HfSiO, HfTaTiO, HfAlON, $(Ba,Sr)TiO_3$ (BST), $Al_2O_3$, any other suitable high-k dielectric materials, or a combination thereof. The dielectric material layer may be formed by chemical vapor deposition or spin-on coating. The chemical vapor deposition may include low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD) of atomic layer chemical vapor deposition or other commonly used methods.

The material of the conductive material layer (e.g., the material of the gate electrode 122) may include amorphous silicon, poly-silicon, one or more metals, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The material of the conductive material layer may be formed by the previously described chemical vapor deposition (CVD), sputtering, resistive thermal evaporation, electron beam evaporation, or any other suitable deposition methods. For example, in some embodiments, the amorphous silicon conductive material layer or poly-silicon conductive material layer may be formed by low-pressure chemical vapor deposition at about 525° C. to 650° C. and the thickness of the amorphous silicon conductive material layer or poly-silicon conductive material layer may be in a range from about 1000 Å to about 10000 Å.

Still referring to FIGS. 1A-1B, according to some embodiments of the present disclosure, sidewall spacers 124 are formed on sidewalls of the gate structure 118. In some embodiments, the sidewall spacers 124 are made of silicon nitride, silicon oxynitride, silicon carbide, other suitable materials, or a combination thereof.

In some embodiments, a spacer layer is deposited over the gate structure 118. The spacer layer may be deposited by chemical vapor deposition process, physical vapor deposition process, spin coating process, other applicable processes, or a combination thereof. Afterward, an etching process (e.g., anisotropic etching) is performed to partially remove the spacer layer. Thus, the remaining portion of the spacer layer on the sidewalls of the gate structure 118 forms sidewall spacers 124.

Still referring to FIGS. 1A-1B, according to some embodiments of the present disclosure, a source region 126 and a drain region 128 are formed to form a semiconductor device 100. The source region 126 is located in the substrate structure 106 at the second side S2 of the gate structure 118, and the drain region 128 is located in the substrate structure 106 at the first side S1 of the gate structure 118.

In some embodiments of the present disclosure, the source region 126 includes a second-conductive-type source region 126A and a first-conductive-type source region 126B adjacent to each other. Both the second-conductive-type source region 126A and the first-conductive-type source region 126B are in the bulk region 108. Additionally, in some embodiments of the present disclosure, the drain region 128 has a second conductive type.

The first-conductive-type source region 126B may be formed by ion implantation. For example, when the first conductive type is P-type, boron ions, indium ions or boron difluoride ions ($BF_2$+) may be implanted in a region where the first-conductive-type source region 126B is formed to form the first-conductive-type source region 126B.

The second-conductive-type source region 126A and the drain region 128 may be formed by ion implantation. For example, when the second-conductive-type is N-type, phosphorus ions or arsenic ions may be implanted in a region where the second-conductive-type source region 126A and the drain region 128 are to be formed to form the second-conductive-type source region 126A and the drain region 128.

In some embodiments of the present disclosure, the second-conductive-type source region 126A, the first-conductive-type source region 126B and the drain region 128 are heavily doped regions. In the described embodiment, "heavily doped" means a dopant concentration in excess of about $10^{19}/cm^3$, such as a dopant concentration of from about $10^{19}/cm^3$ to about $10^{21}/cm^3$. However, it will be appreciated by a person having ordinary skill in the art that the definition of "heavily doped" can also be determined by the particular device type, technical generation, minimum element size, and the like. Thus, the definition of "heavily doped" can be re-evaluated with technological content and is not limited by the embodiments presented herein.

In some embodiments of the present disclosure, the dopant concentrations of the second-conductive-type source region 126A, the first-conductive-type source region 126B and the drain region 128 are greater than the dopant concentration of the semiconductor substrate 102. In some embodiments of the present disclosure, the dopant concentration of the semiconductor substrate 102 is greater than the dopant concentrations of the first-conductive-type doped sub-regions 114A, 114B, 114C, and 114D and the second-conductive-type doped sub-regions 116A, 116B, 116C, and 116D of the super-junction doped structure 112.

In some embodiments of the present disclosure, the dopant concentrations of the first-conductive-type doped sub-regions 114A, 114B, 114C, and 114D and the dopant concentrations of the second-conductive-type doped sub-regions 116A, 116B, 116C, and 116D are greater than the dopant concentration of the bulk region 108 and the dopant concentration of epitaxial layer 104. In some embodiments of the present disclosure, the dopant concentration of the bulk region 108 is substantially the same as the dopant concentration of the epitaxial layer 104.

The terms "substantially" and "essentially" generally mean within 90% of a stated value or range, more typically 95% of the stated value, more typically 98% of the stated value and even more typically 99% of the stated value.

In addition, as shown in FIGS. 1A-1B, according to some embodiments of the present disclosure, a region in the epitaxial layer 104 which located between the two isolation structures 110, and between the gate structure 118 and the drain region 128 is a drift region 130. The drift region 130 is located in the substrate structure 106 at the first side S1 of the gate structure 118. The drift region 130 has a third side S3 and a fourth side S4 opposite to the third side S3.

Still referring to FIGS. 1A-1B, according to some embodiments of the present disclosure, a connect direction of the gate structure 118 to the drain region 128 is a first direction A1, a connect direction of the third side S3 to the fourth side S4 of the drift region 130 is a second direction A2, and a direction parallel to the normal direction of the top surface of the substrate structure 106 is a third direction A3. The first direction A1 is perpendicular to the second direction A2, the second direction A2 is perpendicular to the third direction A3, and the third direction A3 is perpendicular to the first direction A1.

Still referring to FIGS. 1A-1B, according to some embodiments of the present disclosure, the drain region 128 is in the epitaxial layer 104 at the first side S1 of the gate structure 118, and the two isolation structures 110 are respectively located at the third side S3 and the fourth side S4 of the drift region 130.

Still referring to FIGS. 1A-1B, according to some embodiments of the present disclosure, the drift region 130 has a first width Wa along the second direction A2, and one of the first isolation structures 110 has a second width Wb along the second direction A2. A ratio of the first width Wa to the second width Wb is in a range from about 1 to about 4, such as from about 2.33 to about 2.6.

In some embodiments of the present disclosure, the depletion region of the device can be increased, and the on-resistance of the device can be reduced by having a specific ratio relationship between the first width Wa of the drift region 130 along the second direction A2 and the second width Wb of the first isolation structure 110 along the second direction A2, thereby improving device performance.

Still referring to FIGS. 1A-1B, according to some embodiments of the present disclosure, the super-junction doped structure 112 is located in the drift region 130 and between the gate structure 118 and the drain region 128. As shown in FIGS. 1A-1B, according to some embodiments of the present disclosure, widths of the plurality of first-conductive-type doped sub-regions 114A, 114B, 114C and 114D along the first direction A1 decrease from the gate structure 118 to the drain region 128. As shown in FIGS. 1A-1B, according to some embodiments of the present disclosure, widths of the plurality of second-conductive-type doped sub-regions 116A, 116B, 116C and 116D along the first direction A1 decrease from the gate structure 118 to the drain region 128.

In addition, in some embodiments of the present disclosure, for the two adjacent first-conductive-type doped sub-regions, for example, the first-conductive-type doped sub-regions 114A and 114B (also referred to as a first region of the first-conductive-type doped sub-region 114A and a second region of the first-conductive-type doped sub-region 114B), the first region of the first-conductive-type doped sub-region 114A is closer to the gate structure 118 than the second region of the first-conductive-type doped sub-region 114B and has a width W4A along the first direction A1. The second region of the first-conductive-type doped sub-region 114B is closer to the drain region 128 than the first region of the first-conductive-type doped sub-region 114A and has a width W4B along the first direction A1, and a ratio of the width W4B to the width W4A is in a range from about 0.9 to about 0.7, for example, from about 0.8 to about 0.75.

In addition, in some embodiments of the present disclosure, for another two adjacent first-conductive-type doped sub-regions, for example, the first-conductive-type doped sub-regions 114B and 114C (also referred to as the second region of the first-conductive-type doped sub-region 114B and a third region of the first-conductive-type doped sub-region 114C), the second region of the first-conductive-type doped sub-region 114B is closer to the gate structure 118 than the third region of the first-conductive-type doped sub-region 114C and has the width W4B along the first direction A1. The third region of the first-conductive-type doped sub-region 114C is closer to the drain region 128 than the second region of the first-conductive-type doped sub-region 114B and has a width W4C along the first direction A1, and a ratio of the width W4C to the width W4B is in a range from about 0.9 to about 0.7, for example, from about 0.8 to about 0.75.

Furthermore, in some embodiments of the present disclosure, widths of the first-conductive-type doped sub-regions 114C and 114D also have the same or similar ratio relationship, and are not repeated herein.

In addition, in some embodiments of the present disclosure, for the two adjacent second-conductive-type doped sub-regions, for example, the second-conductive-type doped sub-regions 116A and 116B (also referred to as a first region of the second-conductive-type doped sub-region 116A and a second region of the second-conductive-type doped sub-region 116B), the first region of the second-conductive-type doped sub-region 116A is closer to the gate structure 118 than the second region of the second-conductive-type doped sub-region 116B and has a width W6A along the first direction A1. The second region of the second-conductive-type doped sub-region 116B is closer to the drain region 128 than the first region of the second-conductive-type doped sub-region 116A and has a width W6B along the first direction A1, and a ratio of the width W6B to the width W6A is in a range from about 0.9 to about 0.7, for example, from about 0.8 to about 0.75.

In addition, in some embodiments of the present disclosure, for another two adjacent second-conductive-type doped sub-regions, for example, the second-conductive-type doped sub-regions 116B and 116C (also referred to as the second region of the second-conductive-type doped sub-region 116B and a third region of the second-conductive-type doped sub-region 116C), the second region of the second-conductive-type doped sub-region 116B is closer to the gate structure 118 than the third region of the second-conductive-type doped sub-region 116C and has the width W6B along the first direction A1. The third region of the second-conductive-type doped sub-region 116C is closer to the drain region 128 than the second region of the second-conductive-type doped sub-region 116B and has a width W6C along the first direction A1, and a ratio of the width W6C to the width W6B is in a range from about 0.9 to about 0.7, for example, from about 0.8 to about 0.75.

Furthermore, in some embodiments of the present disclosure, widths of the second-conductive-type doped sub-regions 116C and 116D also have the same or similar ratio relationship, and are not repeated herein.

Furthermore, in some embodiments of the present disclosure, the width W4A of the first-conductive-type doped sub-region 114A along the first direction A1 is substantially the same as the width W6A of the second-conductive-type doped sub-region 116A along the first direction A1. Moreover, according to some embodiments of the present disclosure, the width W4B of the first-conductive-type doped sub-region 114B along the first direction A1 is substantially the same as the width W6B of the second-conductive-type doped sub-region 116B along the first direction A1. Moreover, according to some embodiments of the present disclosure, the width W4C of the first-conductive-type doped sub-region 114C along the first direction A1 is substantially the same as the width W6C of the second-conductive-type doped sub-region 116C along the first direction A1. Moreover, according to some embodiments of the present disclosure, the width of the first-conductive-type doped sub-region 114D along the first direction A1 is substantially the same as the width of the second-conductive-type doped sub-region 116D along the first direction A1.

Still referring to FIGS. 1A-1B, according to some embodiments of the present disclosure, depths of the plurality of first-conductive-type doped sub-regions 114A, 114B, 114C, and 114D along the third direction A3 decrease from the gate structure 118 to the drain region 128. Still referring to FIGS. 1A-1B, according to some embodiments of the present disclosure, depths of the plurality of second-conductive-type doped sub-regions 116A, 116B, 116C, and 116D along the third direction A3 decrease from the gate structure 118 to the drain region 128.

In some embodiments of the present disclosure, for the two adjacent first-conductive-type doped sub-regions, for example, the first-conductive-type doped sub-regions 114A and 114B (also referred to as the first region of the first-conductive-type doped sub-region 114A and the second region of the first-conductive-type doped sub-region 114B), the first region of the first-conductive-type doped sub-region 114A is closer to the gate structure 118 than the second region of the first-conductive-type doped sub-region 114B and the second region of the first-conductive-type doped sub-region 114B is closer to the drain region 128 than the first region of the first-conductive-type doped sub-region 114A. A ratio of the depth of the second region of the first-conductive-type doped sub-region 114B along the third direction A3 to the depth of the first region of the first-conductive-type doped sub-region 114A along the third direction A3 is in a range from about 0.9 to about 0.7, for example, from about 0.8 to about 0.75.

In addition, in some embodiments of the present disclosure, for another two adjacent first-conductive-type doped sub-regions, for example, the first-conductive-type doped sub-regions 114B and 114C (also referred to as the second region of the first-conductive-type doped sub-region 114B and the third region of the first-conductive-type doped sub-region 114C), the second region of the first-conductive-type doped sub-region 114B is closer to the gate structure 118 than the third region of the first-conductive-type doped sub-region 114C and the third region of the first-conductive-type doped sub-region 114C is closer to the drain region 128 than the second region of the first-conductive-type doped sub-region 114B. A ratio of the depth of the third region of the first-conductive-type doped sub-region 114C along the third direction A3 to the depth of the second region of the first-conductive-type doped sub-region 114B along the third direction A3 is in a range from about 0.9 to about 0.7, for example, from about 0.8 to about 0.75.

Furthermore, in some embodiments of the present disclosure, the depths of the first-conductive-type doped sub-regions 114C and 114D along the third direction A3 also have the same or similar ratio relationship, and are not repeated herein.

In some embodiments of the present disclosure, for the two adjacent second-conductive-type doped sub-regions, for example, the second-conductive-type doped sub-regions 116A and 116B (also referred to as the first region of the second-conductive-type doped sub-region 116A and the second region of the second-conductive-type doped sub-region 116B), the first region of the second-conductive-type doped sub-region 116A is closer to the gate structure 118 than the second region of the second-conductive-type doped sub-region 116B and the second region of the second-conductive-type doped sub-region 116B is closer to the drain region 128 than the first region of the second-conductive-type doped sub-region 116A. A ratio of the depth of the second region of the second-conductive-type doped sub-region 116B along the third direction A3 to the depth of the first region of the second-conductive-type doped sub-region 116A along the third direction A3 is in a range from about 0.9 to about 0.7, for example, from about 0.8 to about 0.75.

In addition, in some embodiments of the present disclosure, for another two adjacent second-conductive-type doped sub-regions, for example, the second-conductive-type doped sub-regions 116B and 116Ö (also referred to as the second region of the second-conductive-type doped sub-region 116B and the third region of the second-conductive-type doped sub-region 116C), the second region of the second-conductive-type doped sub-region 116B is closer to the gate structure 118 than the third region of the second-conductive-type doped sub-region 116C and the third region of the second-conductive-type doped sub-region 116C is closer to the drain region 128 than the second region of the second-conductive-type doped sub-region 116B. A ratio of the depth of the third region of the second-conductive-type doped sub-region 116C along the third direction A3 to the depth of the second region of the second-conductive-type doped sub-region 116B along the third direction A3 is in a range from about 0.9 to about 0.7, for example, from about 0.8 to about 0.75.

Furthermore, in some embodiments of the present disclosure, the depths of the second-conductive-type doped sub-regions 116C and 116D along the third direction A3 also have the same or similar ratio relationship, and are not repeated herein.

Furthermore, as shown in FIGS. 1A-1B, according to some embodiments of the present disclosure, the depth of the first-conductive-type doped sub-region 114A along the third direction A3 is approximately the same as the depth of the second-conductive-type doped sub-region 116A along the third direction A3. Furthermore, according to some embodiments of the present disclosure, the depth of the first-conductive-type doped sub-region 114B along the third direction A3 is approximately the same as the depth of the second-conductive-type doped sub-region 116B along the third direction A3. Furthermore, according to some embodiments of the present disclosure, the depth of the first-conductive-type doped sub-region 114C along the third direction A3 is approximately the same as the depth of the second-conductive-type doped sub-region 116C along the third direction A3. Furthermore, according to some embodiments of the present disclosure, the depth of the first-conductive-type doped sub-region 114D along the third direction A3 is approximately the same as the depth of the second-conductive-type doped sub-region 116D along the third direction A3.

Still referring to FIGS. 1A-1B, according to some embodiments of the present disclosure, dopant concentrations of the plurality of first-conductive-type doped sub-regions 114A. 114B, 114C, and 114D decrease from the gate structure 118 to the drain region 128. Still referring to FIGS. 1A-1B, according to some embodiments of the present disclosure, dopant concentrations of the plurality of second-conductive-type doped sub-regions 116A, 116B, 116C, and 116D decrease from the gate structure 118 to the drain region 128.

In some embodiments of the present disclosure, for another two adjacent first-conductive-type doped sub-regions, for example, the first-conductive-type doped sub-regions 114A and 114B (also referred to as the first region of the first-conductive-type doped sub-region 114A and the second region of the first-conductive-type doped sub-region 114B), the first region of the first-conductive-type doped sub-region 114A is closer to the gate structure 118 than the second region of the first-conductive-type doped sub-region 114B and the second region of the first-conductive-type doped sub-region 114B is closer to the drain region 128 than the first region of the first-conductive-type doped sub-region 114A. A ratio of the dopant concentration of the second region of the first-conductive-type doped sub-region 114B to the dopant concentration of the first region of the first-conductive-type doped sub-region 114A is in a range from about 0.9 to about 0.7, for example, from about 0.8 to about 0.75.

In addition, in some embodiments of the present disclosure, for other two adjacent first-conductive-type doped sub-regions, for example, the first-conductive-type doped sub-regions 114B and 114C (also referred to as the second region of the first-conductive-type doped sub-region 114B and the third region of the first-conductive-type doped sub-region 114C), the second region of the first-conductive-type doped sub-region 114B is closer to the gate structure 118 than the third region of the first-conductive-type doped sub-region 114C and the third region of the first-conductive-type doped sub-region 114C is closer to the drain region 128 than the second region of the first-conductive-type doped sub-region 114B. A ratio of the dopant concentration of the third region of the first-conductive-type doped sub-region 114C to the dopant concentration of the second region of the first-conductive-type doped sub-region 114B is in a range from about 0.9 to about 0.7, for example, from about 0.8 to about 0.75.

Furthermore, in some embodiments of the present disclosure, the dopant concentrations of the first-conductive-type doped sub-regions 114C and 114D also have the same or similar ratio relationship, and are not repeated herein.

In some embodiments of the present disclosure, for the two adjacent second-conductive-type doped sub-regions, for example, the second-conductive-type doped sub-regions 116A and 116B (also referred to as the first region of the second-conductive-type doped sub-region 116A and the second region of the second-conductive-type doped sub-region 116B), the first region of the second-conductive-type doped sub-region 116A is closer to the gate structure 118 than the second region of the second-conductive-type doped sub-region 116B and the second region of the second-conductive-type doped sub-region 116B is closer to the drain region 128 than the first region of the second-conductive-type doped sub-region 116A. A ratio of the dopant concentration of the second region of the second-conductive-type doped sub-region 116B to the dopant concentration of the first region of the second-conductive-type doped sub-region 116A is in a range from about 0.9 to about 0.7, for example, from about 0.8 to about 0.75.

In addition, in some embodiments of the present disclosure, for another two adjacent second-conductive-type doped sub-regions, for example, the second-conductive-type doped sub-regions 116B and 116C (also referred to as the second region of the second-conductive-type doped sub-region 116B and the third region of the second-conductive-type doped sub-region 116C), the second region of the second-conductive-type doped sub-region 116B is closer to the gate structure 118 than the third region of the second-conductive-type doped sub-region 116C and the third region of the second-conductive-type doped sub-region 116C is closer to the drain region 128 than the second region of the second-conductive-type doped sub-region 116B. A ratio of the dopant concentration of the third region of the second-conductive-type doped sub-region 116C to the dopant concentration of the second region of the second-conductive-type doped sub-region 116B is in a range from about 0.9 to about 0.7, for example, from about 0.8 to about 0.75.

Furthermore, in some embodiments of the present disclosure, the dopant concentrations of the second-conductive-type doped sub-regions 116C and 116D also have the same or similar ratio relationship, and are not repeated herein.

Furthermore, as shown in FIGS. 1A-1B, according to some embodiments of the present disclosure, the dopant concentration of the first-conductive-type doped sub-region 114A is approximately the same as the dopant concentration of the second-conductive-type doped sub-region 116A. Furthermore, according to some embodiments of the present disclosure, the dopant concentration of the first-conductive-type doped sub-region 114B is approximately the same as the dopant concentration of the second-conductive-type doped sub-region 116B. Furthermore, according to some embodiments of the present disclosure, the dopant concentration of the first-conductive-type doped sub-region 114C is approximately the same as the dopant concentration of the second-conductive-type doped sub-region 116C. Furthermore, according to some embodiments of the present disclosure, the dopant concentration of the first-conductive-type doped sub-region 114D is approximately the same as the dopant concentration of the second-conductive-type doped sub-region 116D.

In some embodiments of the present disclosure, the on-resistance of the semiconductor device 100 can be reduced further by utilizing the super-junction doped structure 112 having a particular configuration and a particular width, depth, and/or dopant concentration variation.

Figure 2A:
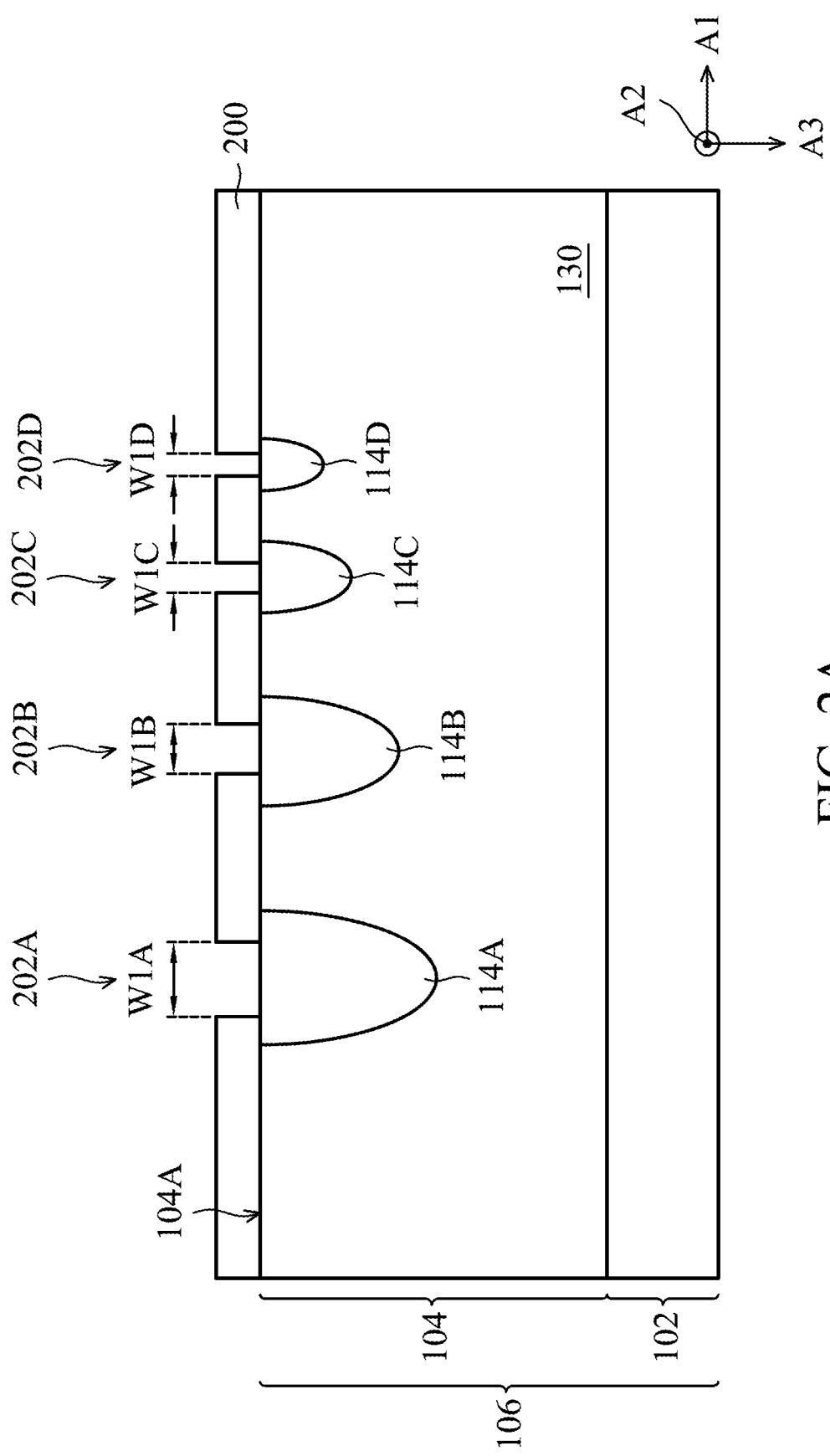
FIGS. 2A and 2B are schematic cross-sectional views showing intermediate stages of a method for fabricating a semiconductor device in accordance with some embodiments of the disclosure.
Figure 2B:
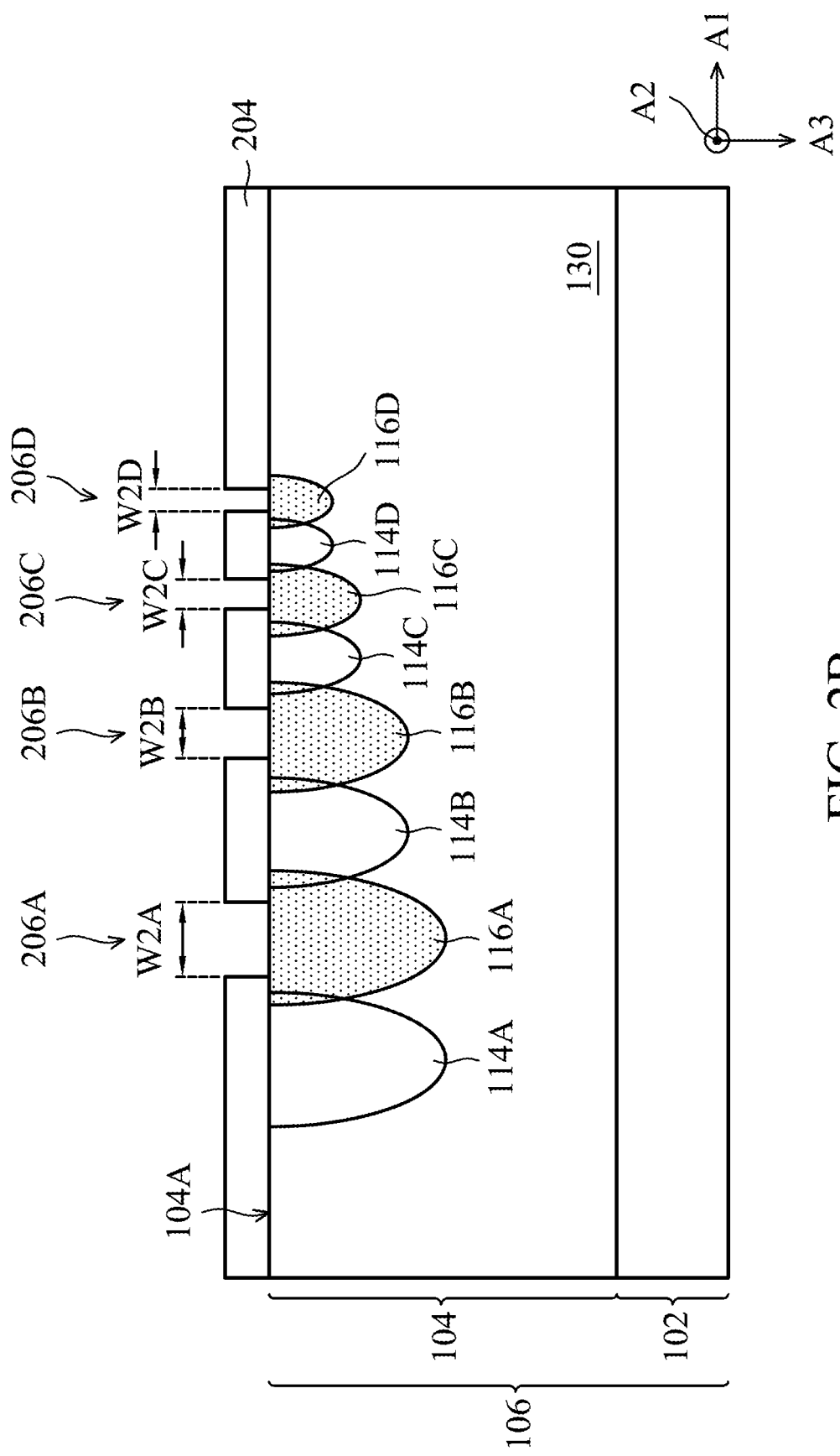

FIGS. 2A-2B are schematic cross-sectional views showing intermediate stages of a method for fabricating a super-junction doped region 112 of a semiconductor device in accordance with some embodiments of the disclosure. As shown in FIG. 2A, a lithography process may be performed to form a mask pattern 200 on a top surface 104A of the epitaxial layer 104 in the drift region 130. The mask pattern 200 may have a plurality of openings 202A, 202B, 202C and 202D exposing the drift region 130. For the sake of clarity, four openings (openings 202A, 202B, 202C, and 202D) are exemplified herein, but not limited thereto. In other embodiments, the number of openings may be altered as needed. In some embodiments shown in FIG. 2A, the opening 202A of the mask pattern 200 is disposed adjacent to the gate structure 118, and the remaining openings 202B, 202C and 202D are sequentially disposed from the gate structure 118 to the drain region 128. In the present embodiment, widths W1A, W1B, WIC, and W1D of the openings 202A, 202B, 202C, and 202D of the mask pattern 200 are designed to sequentially decrease from the gate structure 118 to the drain region 128. For any two adjacent openings of the openings 202A, 202B, 202C, and 202D of the mask pattern 200, the width of the opening closer to the gate structure 118 is greater than the width of the opening relatively far from the gate structure 118. For example, for the two adjacent openings 202A, 202B of the mask pattern 200, the width W1A of the opening 202A closer to the gate structure 118 is greater than the width W1B of the opening 202B relatively far from the gate structure 118. A width relationship between the other two adjacent openings of the mask pattern 200 may have a similar relationship.

Then, please refer to FIG. 2A, the plurality of first-conductive-type doped sub-regions 114A, 114B, 114C and 114D are formed in the drift region 130 exposed by the openings 202A, 202B, 202C and 202D by implanting the first-conductive-type dopant by an ion implantation process using the mask pattern 200 as a mask. Since the widths W1A to W1D of the openings 202A. 202B, 202C, and 202D of the mask pattern 200 sequentially decrease along the first direction A1 (from the gate structure 118 to the drain region 128), the widths, depths, and/or dopant concentrations of the formed first-conductive-type doped sub-regions 114A, 114B, 114C, 114D decrease along the first direction A1. Any two adjacent doped sub-regions of the first-conductive-type doped sub-regions 114A, 114B, 114C, and 114D, the width, depth and/or dopant concentration of the first-conductive-type doped sub-region closer to the central region of the gate structure 118 may be greater than the width, depth, and/or dopant concentration of the first-conductive-type doped sub-region relatively far from the gate structure 118. For example, for the two adjacent first-conductive-type doped sub-regions 114A and 114B, the width, depth and/or dopant concentration of the first-conductive-type doped sub-region 114A closer to the gate structure 118 may be greater than the width, depth, and/or dopant concentration of the first-conductive-type doped sub-region 114B relatively far from the gate structure 118. The depth relationship of the other adjacent two first-conductive-type doped sub-regions may have the similar relationship. Thereafter, the mask pattern 200 is removed.

Next, referring to FIG. 2B, another lithography process may be performed to form a mask pattern 204 on the top surface 104A of the epitaxial layer 104 in the drift region 130. The mask pattern 204 may have a plurality of openings 206A, 206B, 206C and 206D exposing the drift region 130. For the sake of clarity, the four openings (openings 206A, 206B, 206C, and 206D) are exemplified herein, but not limited thereto. In other embodiments, the number of openings may be altered as needed. A relationship of widths W2A to W2D of the openings 206A, 206B, 206C, and 206D of the mask pattern 204 may be similar to the openings 202A, 202B, 202C, and 202D of the mask pattern 200 described above, and will not be repeated herein.

In other embodiments, the openings of the mask pattern 204 may also be designed to have other widths, as long as the widths of the openings decrease from the gate structure 118 to the drain region 128.

Then, please refer to FIG. 2B, a plurality of second-conductive-type doped sub-regions 116A. 116B, 116C and 116D are formed in the drift region 130 exposed by the openings 206A, 206B, 206C and 206D by implanting the second-conductive-type dopant by an ion implantation process using the mask pattern 204 as a mask. The second-conductive-type doped sub-regions 116A, 116B, 116C and 116D are adjacent to the first-conductive-type doped sub-regions 114A, 114B, 114C and 114D, respectively. The width, depth, and/or dopant concentration relationship of the second-conductive-type doped sub-regions 116A, 116B, 116C and 116D may be similar to the first-conductive-type doped sub-regions 114A, 114B, 114C, 114D, and will not be repeated herein. Thereafter, the mask pattern 204 is removed.

Then, an annealing process is performed to uniformly diffuse the dopants of the first-conductive-type doped sub-regions 114A, 114B, 114C, and 114D and the second-conductive-type doped sub-regions 116A, 116B, 116C, and 116D shown in FIG. 2B to form the super-junction doped structure 112 having a plurality of PN junctions, as shown in FIGS. 1A-1B.

Figure 3A:
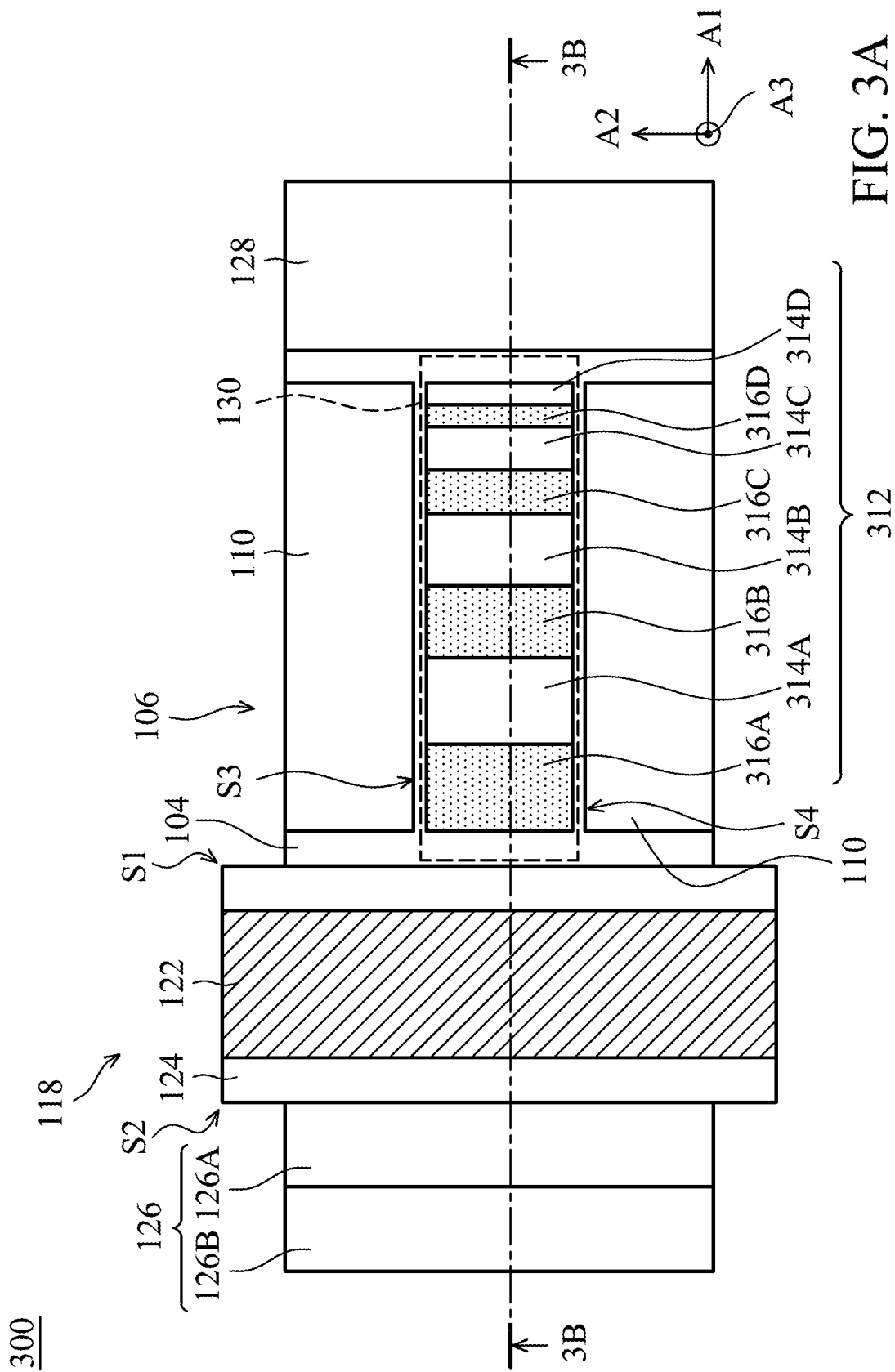
FIG. 3A is a top view of a semiconductor device in accordance with some embodiments of the disclosure.
Figure 3B:
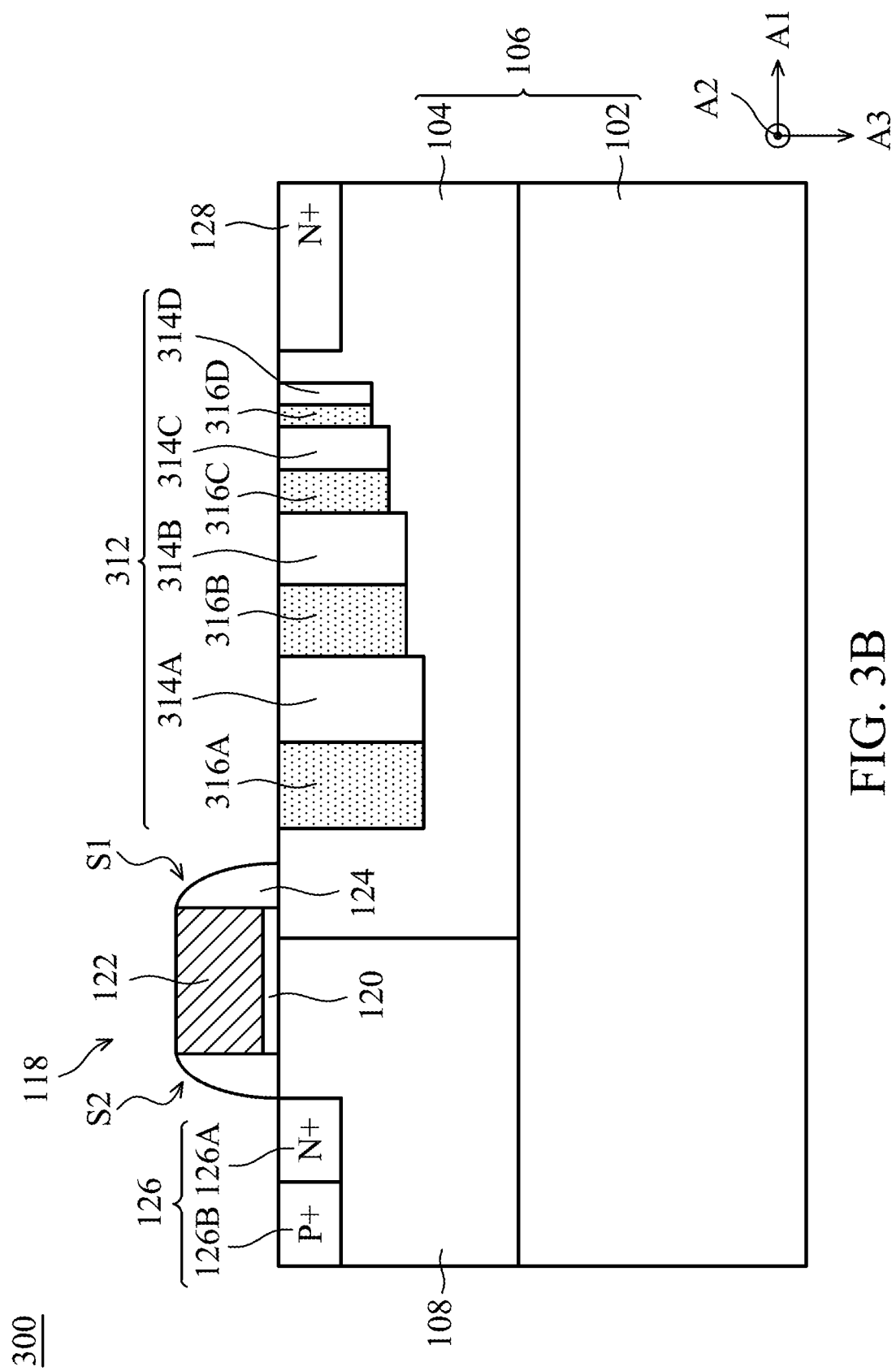
FIG. 3B is a cross-sectional view along line 3B-3B in FIG. 3A.

It should be noted that the embodiments shown in FIGS. 1A-1B are for illustrative purposes only, and the scope of some embodiments of the present disclosure is not limited thereto. In addition to the embodiments shown in FIGS. 1A-1B the super-junction doped structure of some embodiments of the present disclosure may have other patterns, as shown in the embodiment of FIGS. 3A-3B, which will be described later. Therefore, the scope of some embodiments of the present disclosure is not limited to the embodiments shown in FIGS. 1A-1B.

It should be noted that elements or layers that are the same or similar to those in the present disclosure will be denoted by the same or similar reference numerals, and the materials, manufacturing methods and functions thereof are the same or similar to those described above, and therefore will not be repeated later.

Referring to FIGS. 3A-3B, FIG. 3A is a top view of a semiconductor device in accordance with some embodiments of the disclosure. FIG. 3B is a cross-sectional view along line 3B-3B in FIG. 3A. The difference between the embodiment shown in FIGS. 3A-3B and the embodiment shown in FIGS. 1A-1B is that the second-conductive-type doped sub-region 316A of the super-junction doped structure 312 is closer to the gate structure 118 than the first-conductive-type doped sub-region 314A. In some embodiments of the present disclosure, the second-conductive-type doped sub-region 316B is closer to the gate structure 118 than the first-conductive-type doped sub-region 314B. In some embodiments of the present disclosure, the second-conductive-type doped sub-region 316C is closer to the gate structure 118 than the first-conductive-type doped sub-region 314C. In some embodiments of the present disclosure, the second-conductive-type doped sub-region 316D is closer to the gate structure 118 than the first-conductive-type doped sub-region 314D.

It should be noted that the embodiments shown in FIGS. 1A-3B are for illustrative purposes only, and the scope of some embodiments of the present disclosure is not limited thereto. In addition to the embodiments shown in FIGS. 1A-3B, some embodiments of the present disclosure may form a super-junction doped structure array, as shown in the embodiments of FIGS. 4A-5B, which will be described in detail later. Therefore, the scope of some embodiments of the present disclosure is not limited to the embodiments shown in FIGS. 1A-3B.

It should be noted that elements or layers that are the same or similar to those in the present disclosure will be denoted by the same or similar reference numerals, and the materials, manufacturing methods and functions thereof are the same or similar to those described above, and therefore will not be repeated later.

Figure 4A:
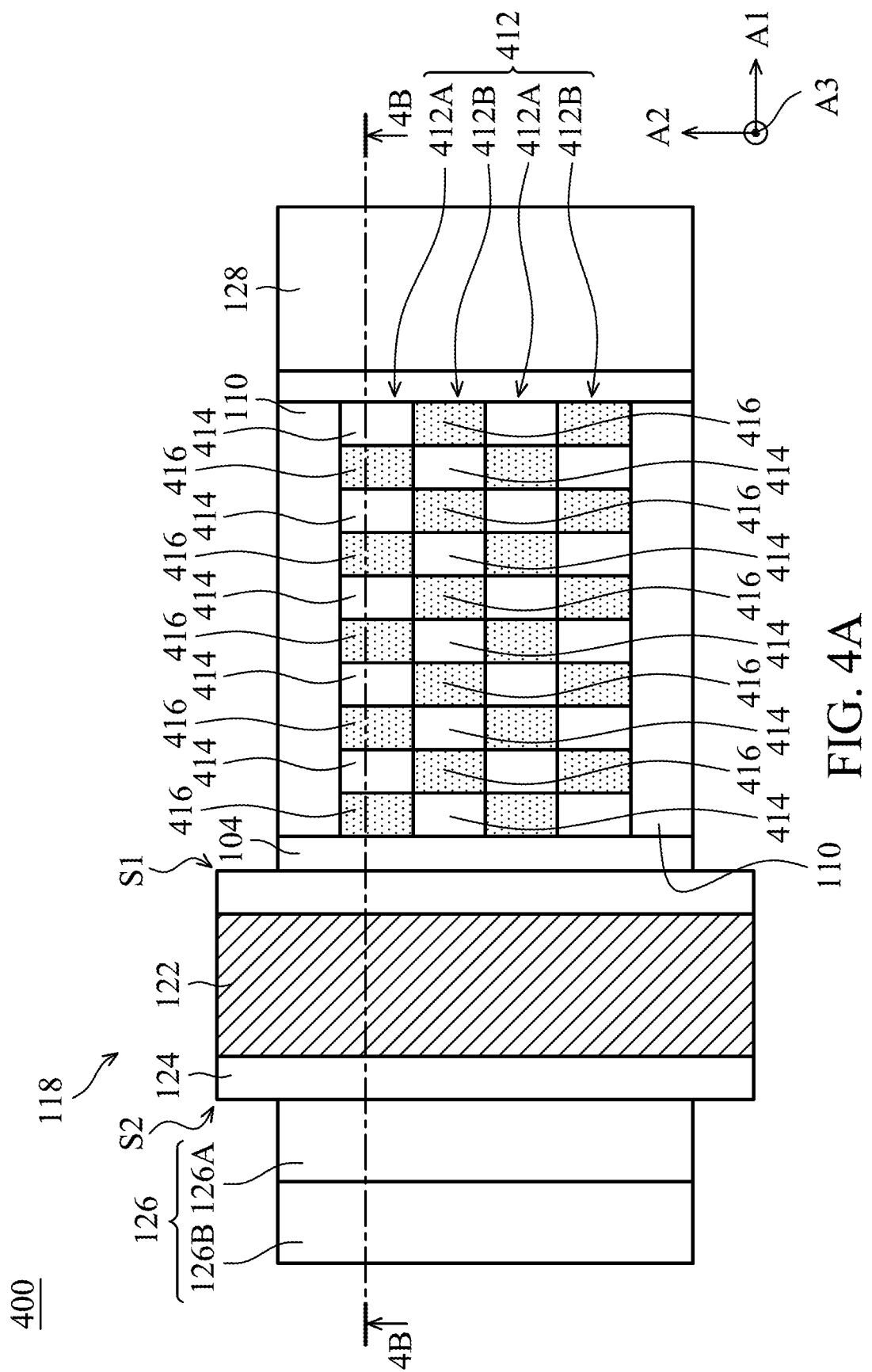
FIG. 4A is a top view of a semiconductor device in accordance with some embodiments of the disclosure.
Figure 4B:
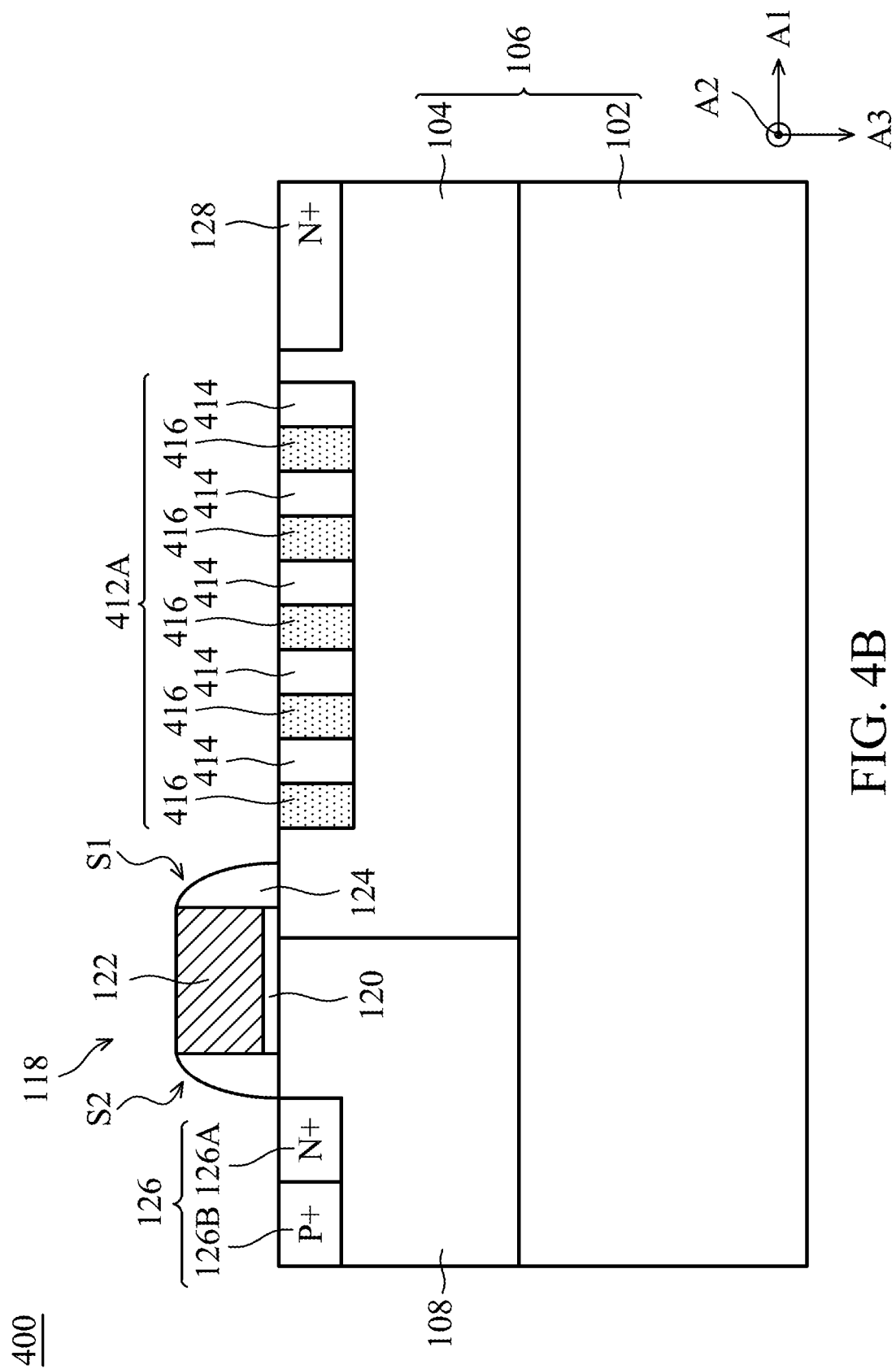
FIG. 4B is a cross-sectional view along line 4B-4B in FIG. 4A.

FIG. 4A is a top view of a semiconductor device 400 in accordance with some embodiments of the present disclosure. FIG. 4B is a cross-sectional view along line 4B-4B in FIG. 4A. As shown in FIGS. 4A-4B, according to some embodiments of the present disclosure, a super-junction doped structure array 412 is formed in the drift region 130 and between the gate structure 118 and the drain region 128.

As shown in FIGS. 4A-4B, in accordance with some embodiments of the present disclosure, the super junction doped structure array 412 includes adjacent first super-junction doped structure row 412A and second super junction doped structure row 412B. In some embodiments of the present disclosure, each of the first super-junction doped structure row 412A and the second super-junction doped structure row 412B independently includes a plurality of first-conductive-type doped sub-regions 414 and a plurality of second-conductive-type doped sub-region 416. The plurality of first-conductive-type doped sub-regions 414 extend along the third direction A3 and are disposed along the first direction A1 and have the first conductive type. The plurality of second-conductive-type doped sub-regions 416 extend along the third direction A3 and are disposed along the first direction A1 and have the second conductive type. In some embodiments of the present disclosure, the first conductive type is different from the second conductive type.

In some embodiments of the present disclosure, in the first super-junction doped structure row 412A and the second super-junction doped structure row 412B, the plurality of first-conductive-type doped sub-regions 414 and the plurality of second-conductive-type doped sub-regions 416 are alternately disposed.

In some embodiments of the present disclosure, although the FIGS. 4A-4B only illustrate two rows of the first-super junction doped structure row 412A and the two rows of the second super-junction doped structure row 412B, the embodiment of the present disclosure not limited to this. In other embodiments of the present disclosure, the super-junction doped structure array 412 may include more or fewer rows of the first super-junction doped structure row 412A and the second super-junction doped structure row 412B.

In some embodiments of the present disclosure, the first-conductive-type doped sub-regions 414 may be formed by an ion implantation process. For example, when the first conductive type is P-type, boron ions, indium ions, or boron difluoride ions ($BF_2+$) may be implanted in a region where the first-conductive-type doped sub-regions 414 are to be formed to form the first-conductive-type doped sub-regions 414.

In some embodiments of the present disclosure, the second-conductive-type doped sub-regions 416 may be formed by an ion implantation process. For example, when the second conductive type is N-type, phosphorous or arsenic ions may be implanted in a region where the second-conductive-type doped sub-regions 416 is to be formed to form the second-conductive-type doped sub-regions 416. The super-junction doped structure array 412 may be formed by the above two ion implantation processes.

Still referring to FIGS. 4A-4B, according to some embodiments of the present disclosure, the first-conductive-type doped sub-region 414 of the first super-junction doped structure row 412A contacts the second-conductive-type doped sub-region 416 of the second super-junction doped structure row 412B. In some embodiments of the present disclosure, the first-conductive-type doped sub-region 414 of the first super-junction doped structure row 412A is aligned with the second-conductive-type doped sub-region 416 of the second super-junction doped structure row 412B.

Still referring to FIGS. 4A-4B, according to some embodiments of the present disclosure, the second-conductive-type doped sub-region 416 of the first super-junction doped structure row 412A contacts the first-conductive-type doped sub-region 414 of the second super-junction doped structure row 412B. In some embodiments of the present disclosure, the second-conductive-type doped sub-region 416 of the first super-junction doped structure row 412A is aligned with the first-conductive-type doped sub-region 414 of the second super-junction doped structure row 412B.

Still referring to FIGS. 4A-4B, according to some embodiments of the present disclosure, the widths, depths, and/or dopant concentrations of the first-conductive-type doped sub-regions 414 of the first super-junction doped structure row 412A are substantially the same as the widths, depths, and/or dopant concentrations of the second-conductive-type doped sub-regions 416 of the first super-junction doped structure row 412A.

Still referring to FIGS. 4A-4B, according to some embodiments of the present disclosure, the widths, depths, and/or dopant concentrations of the first-conductive-type doped sub-regions 414 of the second super-junction doped structure row 412B are substantially the same as the widths, depths, and/or dopant concentrations of the second-conductive-type doped sub-regions 416 of the second super-junction doped structure row 412B.

In some embodiments of the present disclosure, the on-resistance of the semiconductor device 400 can be reduced further by the super-junction doped structure array 412 having a specific configuration.

Figure 5A:
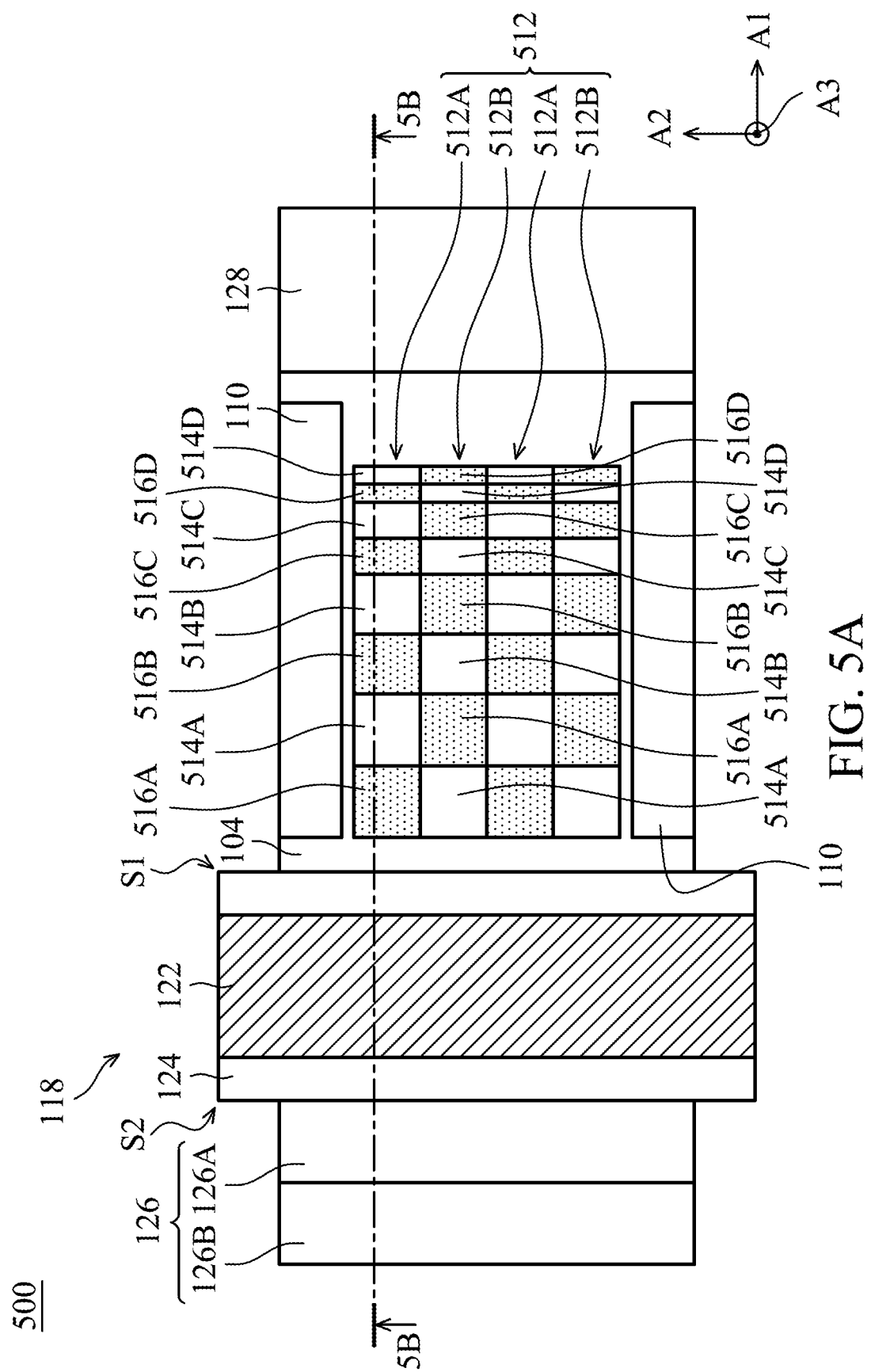
FIG. 5A is a top view of a semiconductor device in accordance with some embodiments of the disclosure.
Figure 5B:
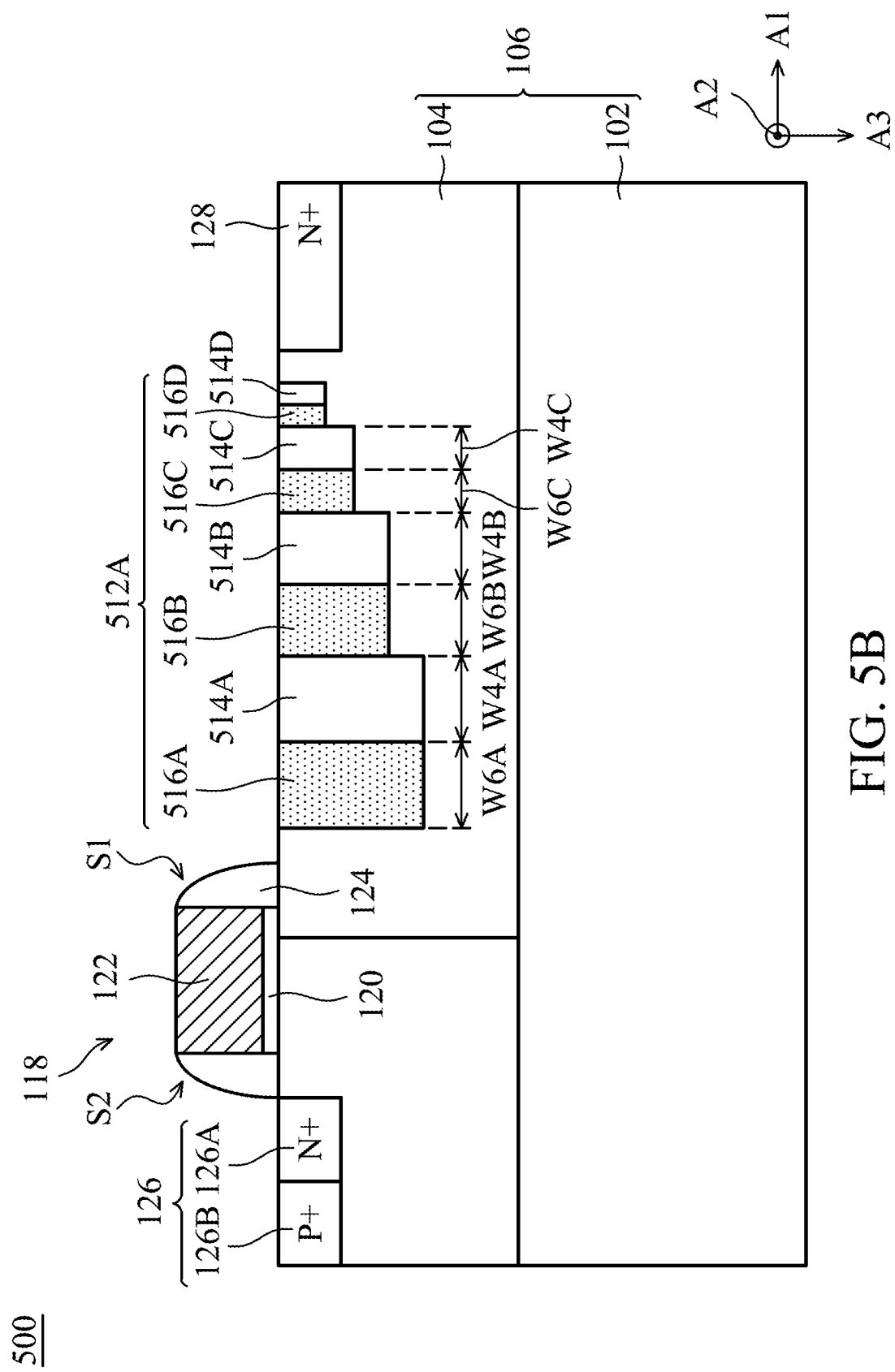
FIG. 5B is a cross-sectional view along line 5B-5B in FIG. 5A.

It should be noted that the embodiments shown in FIGS. 4A-4B are for illustrative purposes only, and the scope of some embodiments of the present disclosure is not limited thereto. In addition to the embodiments shown in FIGS. 4A-4B, the super-junction doped structure array of some embodiments of the present disclosure may have other configurations, as shown in the embodiment of FIGS. 5A-5B, which will be described in detail later. Therefore, the scope of some embodiments of the present disclosure is not limited to the embodiments shown in FIGS. 4A-4B.

It should be noted that elements or layers that are the same or similar to those in the present disclosure will be denoted by the same or similar reference numerals, and the materials, manufacturing methods and functions thereof are the same or similar to those described above, and therefore will not be repeated later.

FIG. 5A is a top view of a semiconductor device 500 in accordance with some embodiments of the present disclosure. FIG. 5B is a cross-sectional view along line 5B-5B in FIG. 5A. As shown in FIGS. 5A-5B, according to some embodiments of the present disclosure, the super-junction doped structure array 512 includes one or more first super-junction doped structure rows 512A and one or more second super junction doped structure rows 512B. The difference between the embodiment shown in FIGS. 5A-5B and the embodiment of FIGS. 4A-4B is that, according to some embodiments of the present disclosure, widths of the plurality of first-conductive-type doped sub-regions 514A, 514B, 514C, and 514D of the first super-junction doped structure row 512A along the first direction A1 decrease from the gate structure 118 to the drain region 128. As shown in FIGS. 5A-5B, according to some embodiments of the present disclosure, widths of the plurality of second-conductive-type doped sub-regions 516A, 516B, 516C, and 516D of the first super-junction doped structure row 512A along the first direction A1 decrease from the gate structure 118 to the drain region 128.

In addition, in some embodiments of the present disclosure, for the two adjacent first-conductive-type doped sub-regions, for example, the first-conductive-type doped sub-regions 514A and 514B (also referred to as a first region of the first-conductive-type doped sub-region 514A and a second region of the first-conductive-type doped sub-region 514B), the first region of the first-conductive-type doped sub-region 514A is closer to the gate structure 118 than the second region of the first-conductive-type doped sub-region 514B and has a width W4A along the first direction A1. The second region of the first-conductive-type doped sub-region 514B is closer to the drain region 128 than the first region of the first-conductive-type doped sub-region 514A and has a width W4B along the first direction A1. A ratio of the width W4B to the width W4A is in a range from about 0.9 to about 0.7, for example, from about 0.8 to about 0.75.

In addition, in some embodiments of the present disclosure, for another two adjacent first-conductive-type doped sub-regions, for example, the first-conductive-type doped sub-regions 514B and 5140 (also referred to as the second region of the first-conductive-type doped sub-region 514B and a third region of the first-conductive-type doped sub-region 514C), the second region of the first-conductive-type doped sub-region 514B is closer to the gate structure 118 than the third region of the first-conductive-type doped sub-region 514C and has a width W4B along the first direction A1. The third region of the first-conductive-type doped sub-region 514C is closer to the drain region 128 than the second region of the first-conductive-type doped sub-region 514B and has a width W4C along the first direction A1. A ratio of the width W4C to the width W4B is in a range from about 0.9 to about 0.7, for example, from about 0.8 to about 0.75.

Furthermore, in some embodiments of the present disclosure, widths of the first-conductive-type doped sub-regions 514C and 514D also have the same or similar ratio relationship, and are not repeated herein.

In some embodiments of the present disclosure, for the two adjacent second-conductive-type doped sub-regions, for example, the second-conductive-type doped sub-regions 516A and 516B (also referred to as a first region of the second-conductive-type doped sub-region 516A and a second region of the second-conductive-type doped sub-region 516B), the first region of the second-conductive-type doped sub-region 516A is closer to the gate structure 118 than the second region of the second-conductive-type doped sub-region 516B and has a width W6A along the first direction A1. The second region of the second-conductive-type doped sub-region 516B is closer to the drain region 128 than the first region of the second-conductive-type doped sub-region 516A and has a width W6B along the first direction A1. A ratio of the width W6B to the width W6A is in a range from about 0.9 to about 0.7, for example, from about 0.8 to about 0.75.

In addition, in some embodiments of the present disclosure, for another two adjacent second-conductive-type doped sub-regions, for example, the second-conductive-type doped sub-regions 516B and 516C (also referred to as a second region of the second-conductive-type doped sub-region 516B and a third region of the second-conductive-type doped sub-region 516C), the second region of the second-conductive-type doped sub-region 516B is closer to the gate structure 118 than the third region of the second-conductive-type doped sub-region 516C and has a width W6B along the first direction A1. The third region of the second-conductive-type doped sub-region 516C is closer to the drain region 128 than the second region of the second-conductive-type doped sub-region 516B and has a width W6C along the first direction A1. A ratio of the width W6C to the width W6B is in a range from about 0.9 to about 0.7, for example, from about 0.8 to about 0.75.

Furthermore, in some embodiments of the present disclosure, widths of the second-conductive-type doped sub-regions 516C and 516D also have the same or similar ratio relationship, and are not repeated herein.

Furthermore, as shown in FIGS. 5A-5B, according to some embodiments of the present disclosure, the width W4A of the first-conductive-type doped sub-region 514A along the first direction A1 is substantially the same as the width W6A of the second-conductive-type doped sub-region 516A along the first direction A1. Moreover, according to some embodiments of the present disclosure, the width W4B of the first-conductive-type doped sub-region 514B along the first direction A1 is substantially the same as the width W6B of the second-conductive-type doped sub-region 516B along the first direction A1. Moreover, according to some embodiments of the present disclosure, the width W4C of the first-conductive-type doped sub-region 514C along the first direction A1 is substantially the same as the width W6C of the second-conductive-type doped sub-region 516C along the first direction A1. Moreover, according to some embodiments of the present disclosure, the width of the first-conductive-type doped sub-region 514D along the first direction A1 is substantially the same as the width of the second-conductive-type doped sub-region 516D along the first direction A1.

Still referring to FIGS. 5A-5B, according to some embodiments of the present disclosure, depths of the plurality of first-conductive-type doped sub-regions 514A, 514B, 514C, and 514D of the first super-junction doped structure row 512A along the third direction A3 decrease from the gate structure 118 to the drain region 128. Still referring to FIGS. 5A-5B, according to some embodiments of the present disclosure, depths of plurality of second-conductive-type doped sub-regions 516A, 516B, 516C, and 516D along the third direction A3 decrease from the gate structure 118 to the drain region 128.

In some embodiments of the present disclosure, for the two adjacent first-conductive-type doped sub-regions of the first super-junction doped structure row 512A, for example, the first-conductive-type doped sub-regions 514A and 514B (also referred to as the first region of the first-conductive-type doped sub-region 514A and the second region of the first-conductive-type doped sub-region 514B), the first region of the first-conductive-type doped sub-region 514A is closer to the gate structure 118 than the second region of the first-conductive-type doped sub-region 514B and the second region of the first-conductive-type doped sub-region 514B is closer to the drain region 128 than the first region of the first-conductive-type doped sub-region 514A. A ratio of the depth of the second region of the first-conductive-type doped sub-region 514B along the third direction A3 to the depth of the first region of the first-conductive-type doped sub-region 514A along the third direction A3 is in a range from about 0.9 to about 0.7, for example, from about 0.8 to about 0.75.

In addition, in some embodiments of the present disclosure, for another two adjacent first-conductive-type doped sub-regions, for example, the first-conductive-type doped sub-regions 514B and 514C (also referred to as the second region of the first-conductive-type doped sub-region 514B and the third region of the first-conductive-type doped sub-region 514C), the second region of the first-conductive-type doped sub-region 514B is closer to the gate structure 118 than the third region of the first-conductive-type doped sub-region 514C and the third region of the first-conductive-type doped sub-region 514C is closer to the drain region 128 than the second region of the first-conductive-type doped sub-region 514B. A ratio of the depth of the third region of the first-conductive-type doped sub-region 514C along the third direction A3 to the depth of the second region of the first-conductive-type doped sub-region 514B along the third direction A3 is in a range from about 0.9 to about 0.7, for example, from about 0.8 to about 0.75.

Furthermore, in some embodiments of the present disclosure, the depths of the first-conductive-type doped sub-regions 514C and 514D along the third direction A3 also have the same or similar ratio relationship, and are not repeated herein.

In some embodiments of the present disclosure, for the two adjacent second-conductive-type doped sub-regions of the first super-junction doped structure row 512A, for example, the second-conductive-type doped sub-regions 516A and 516B (also referred to as the first region of the second-conductive-type doped sub-region 516A and the second region of the second-conductive-type doped sub-region 516B), the first region of the second-conductive-type doped sub-region 516A is closer to the gate structure 118 than the second region of the second-conductive-type doped sub-region 516B and the second region of the second-conductive-type doped sub-region 516B is closer to the drain region 128 than the first region of the second-conductive-type doped sub-region 516A. A ratio of the depth of the second region of the second-conductive-type doped sub-region 516B along the third direction A3 to the depth of the first region of the second-conductive-type doped sub-region 516A along the third direction A3 is in a range from about 0.9 to about 0.7, for example, from about 0.8 to about 0.75.

In addition, in some embodiments of the present disclosure, for another two adjacent second-conductive-type doped sub-regions, for example, the second-conductive-type doped sub-regions 516B and 516C (also referred to as the second region of the second-conductive-type doped sub-region 516B and the third region of the second-conductive-type doped sub-region 516C), the second region of the second-conductive-type doped sub-region 516B is closer to the gate structure 118 than the third region of the second-conductive-type doped sub-region 516C and the third region of the second-conductive-type doped sub-region 516C is closer to the drain region 128 than the second region of the second-conductive-type doped sub-region 516B. A ratio of the depth of the third region of the second-conductive-type doped sub-region 516C along the third direction A3 to the depth of the second region of the second-conductive-type doped sub-region 516B along the third direction A3 is in a range from about 0.9 to about 0.7, for example, from about 0.8 to about 0.75.

Furthermore, in some embodiments of the present disclosure, the depths of the second-conductive-type doped sub-regions 516C and 516D along the third direction A3 also have the same or similar ratio relationship, and are not repeated herein.

Furthermore, as shown in FIGS. 5A-5B, according to some embodiments of the present disclosure, the depth of the first-conductive-type doped sub-region 514A along the third direction A3 is approximately the same as the depth of the second-conductive-type doped sub-region 516A along the third direction A3. Furthermore, according to some embodiments of the present disclosure, the depth of the first-conductive-type doped sub-region 514B along the third direction A3 is approximately the same as the depth of the second-conductive-type doped sub-region 516B along the third direction A3. Furthermore, according to some embodiments of the present disclosure, the depth of the first-conductive-type doped sub-region 514C along the third direction A3 is approximately the same as the depth of the second-conductive-type doped sub-region 516C along the third direction A3. Furthermore, according to some embodiments of the present disclosure, the depth of the first-conductive-type doped sub-region 514D along the third direction A3 is approximately the same as the depth of the second-conductive-type doped sub-region 516D along the third direction A3.

Still referring to FIGS. 5A-5B, according to some embodiments of the present disclosure, dopant concentrations of the plurality of first-conductive-type doped sub-regions 514A, 514B, 514C, and 514D of the first super-junction doped structure row 512A decrease from the gate structure 118 to the drain region 128. Still referring to FIGS. 5A-5B, according to some embodiments of the present disclosure, dopant concentrations of the plurality of second-conductive-type doped sub-regions 516A, 516B, 516C, and 516D decrease from the gate structure 118 to the drain region 128.

In some embodiments of the present disclosure, for the two adjacent first-conductive-type doped sub-regions of the first super-junction doped structure row 512A, for example, the first-conductive-type doped sub-regions 514A and 514B (also referred to as the first region of the first-conductive-type doped sub-region 514A and the second region of the first-conductive-type doped sub-region 514B), the first region of the first-conductive-type doped sub-region 514A is closer to the gate structure 118 than the second region of the first-conductive-type doped sub-region 514B and the second region of the first-conductive-type doped sub-region 514B is closer to the drain region 128 than the first region of the first-conductive-type doped sub-region 514A. A ratio of the dopant concentration of the second region of the first-conductive-type doped sub-region 514B to the dopant concentration of the first region of the first-conductive-type doped sub-region 514A is in a range from about 0.9 to about 0.7, for example, from about 0.8 to about 0.75.

In addition, in some embodiments of the present disclosure, for another two adjacent first-conductive-type doped sub-regions, for example, the first-conductive-type doped sub-regions 514B and 514C (also referred to as the second region of the first-conductive-type doped sub-region 514B and the third region of the first-conductive-type doped sub-region 514C), the second region of the first-conductive-type doped sub-region 514B is closer to the gate structure 118 than the third region of the first-conductive-type doped sub-region 514C and the third region of the first-conductive-type doped sub-region 514C is closer to the drain region 128 than the second region of the first-conductive-type doped sub-region 514B. A ratio of the dopant concentration of the third region of the first-conductive-type doped sub-region 514C to the dopant concentration of the second region of the first-conductive-type doped sub-region 514B is in a range from about 0.9 to about 0.7, for example, from about 0.8 to about 0.75.

Furthermore, in some embodiments of the present disclosure, the dopant concentrations of the first-conductive-type doped sub-regions 114C and 114D also have the same or similar ratio relationship, and, are not repeated herein.

In some embodiments of the present disclosure, for the two adjacent second-conductive-type doped sub-regions of the first super-junction doped structure row 512A, for example, the second-conductive-type doped sub-regions 516A and 516B (also referred to as the first region of the second-conductive-type doped sub-region 516A and the second region of the second-conductive-type doped sub-region 516B), the first region of the second-conductive-type doped sub-region 516A is closer to the gate structure 118 than the second region of the second-conductive-type doped sub-region 516B and the second region of the second-conductive-type doped sub-region 516B is closer to the drain region 128 than the first region of the second-conductive-type doped sub-region 516A. A ratio of the dopant concentration of the second region of the second-conductive-type doped sub-region 516B to the dopant concentration of the first region of the second-conductive-type doped sub-region 516A is in a range from about 0.9 to about 0.7, for example, from about 0.8 to about 0.75.

In addition, in some embodiments of the present disclosure, for another two adjacent second-conductive-type doped sub-regions, for example, the second-conductive-type doped sub-regions 516B and 516C (also referred to as the second region of the second-conductive-type doped sub-region 516B and the third region of the second-conductive-type doped sub-region 516C), the second region of the second-conductive-type doped sub-region 516B is closer to the gate structure 118 than the third region of the second-conductive-type doped sub-region 516C and the third region of the second-conductive-type doped sub-region 516C is closer to the drain region 128 than the second region of the second-conductive-type doped sub-region 516B. A ratio of the dopant concentration of the third region of the second-conductive-type doped sub-region 516C to the dopant concentration of the second region of the second-conductive-type doped sub-region 516B is in a range from about 0.9 to about 0.7, for example, from about 0.8 to about 0.75.

Furthermore, in some embodiments of the present disclosure, the dopant concentrations of the second-conductive-type doped sub-regions 516C and 516D also have the same or similar ratio relationship, and are not repeated herein.

Furthermore, as shown in FIGS. 5A-5B, according to some embodiments of the present disclosure, the dopant concentration of the first-conductive-type doped sub-region 514A is approximately the same as the dopant concentration of the second-conductive-type doped sub-region 516A. Furthermore, according to some embodiments of the present disclosure, the dopant concentration of the first-conductive-type doped sub-region 514B is approximately the same as the dopant concentration of the second-conductive-type doped sub-region 516B. Furthermore, according to some embodiments of the present disclosure, the dopant concentration of the first-conductive-type doped sub-region 514C is approximately the same as the dopant concentration of the second-conductive-type doped sub-region 516C. Furthermore, according to some embodiments of the present disclosure, the dopant concentration of the first-conductive-type doped sub-region 514D is approximately the same as the dopant concentration of the second-conductive-type doped sub-region 516D.

In some embodiments of the present disclosure, widths, depths, and/or dopant concentrations of the plurality of first-conductive-type doped sub-regions 514A, 514B, 514C and 514D and the plurality of second-conductive-type doped sub-regions 516A, 516B, 516C and 516D of the second super junction doped structure row 512B also have the same or similar ratio relationship to the widths, depths, and/or dopant concentrations of the plurality of first-conductive-type doped sub-regions 514A, 514B, 514C and 514D and the plurality of second-conductive-type doped sub-regions 516A, 516B, 516C and 516D of the first super-junction doped structure row 512A, and thus are not repeated herein.

In addition, in some embodiments of the present disclosure, the method for forming the super-junction doped structure array 512 is similar to the method for forming the super-junction doped structure 112 described above, and thus is not repeated herein.

In some embodiments of the present disclosure, the on-resistance of the semiconductor device 500 can be reduced further with the super-junction doped structure array 512 having a specific configuration.

In summary, some embodiments of the present disclosure utilize isolation structures and a drift region having a particular width ratio to reduce the on-resistance of the semiconductor device. In addition, in some embodiments of the present disclosure, the on-resistance of the semiconductor device can be reduced further with a super-junction doped structure having a specific configuration and a specific width, depth, and/or dopant concentration variation. Alternatively, in some embodiments of the present disclosure, the on-resistance of the semiconductor device can be reduced further with a super-junction doped structure array having a specific configuration. In some embodiments of the present disclosure, some embodiments of the present disclosure may reduce the on-resistance by about 20% to about 60%.

In addition, it should be noted that although in the above embodiments, the first conductive type is P type and the second conductive type is N type, however, a person having ordinary skill in the art can understand the first conductive type can also be N-type, while the second conductive type is P-type.

In addition, it should be noted that a person having ordinary skill in the art will understand that the drain and source described in the embodiments of the present disclosure may be exchangeable, depending on the voltage levels to which they are connected.

It should be noted that the element sizes, element parameters, and element shapes described above are not limitations of the present disclosure. Those of ordinary skill in the art may modify these settings according to different needs. Furthermore, the semiconductor devices of the embodiments of the present disclosure are not limited to the state as illustrated in FIGS. 1A-5B. Some embodiments of the present disclosure may include any one or more features of the one or more embodiments of FIGS. 1A-5B. In other words, not all illustrated features must be simultaneously implemented in a semiconductor device of some embodiments of the present disclosure.

In addition, although the dopant concentrations of each doped regions in some embodiments are set forth above. However, those of ordinary skill in the art should appreciate that the dopant concentration of each doped region can be determined by the particular device type, technology generation, minimum element size, and the like. Thus, the dopant concentration of each doped region can be adjusted according to the technical content and is not limited to the embodiments presented herein.

Some embodiments of the present disclosure may be applied to semiconductor device structures having planar field effect transistors and/or fin field effect transistors. Moreover, some embodiments of the present disclosure are not limited and can be applied to any suitable technology generation, such as 7 nm, 5 nm or other suitable nodes.

Although some embodiments of the present disclosure and their advantages have been described in detail, it should be understood that various changes, substitutions and alterations can be made herein without departing from the spirit and scope of the embodiments of the present disclosure. Moreover, the scope of the present disclosure is not intended to be limited to the particular embodiments of the process, machine, manufacture, composition of matter, means, methods and steps described in the specification. As one of ordinary skill in the art will readily appreciate from the embodiments of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the scope of the present disclosure is intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device, comprising:
   a substrate structure;
   a bulk region in the substrate structure and having a first conductive type;
   a gate structure on the substrate structure and having a first side and a second side opposite to the first side;
   a drift region in the substrate structure at the first side of the gate structure and having a third side and a fourth side opposite to the third side;
   a source region in the bulk region at the second side of the gate structure;
   a drain region in the substrate structure at the first side of the gate structure and having a second conductive type, wherein the first conductive type is different from the second conductive type, wherein a connect direction between the gate structure and the drain region is a first direction and a connect direction between the third side and the fourth side of the drift region is a second direction, wherein the first direction is perpendicular to the second direction;
   two isolation structures at the third side and the fourth side of the drift region respectively, wherein the drift region has a first width along the second direction, wherein one of the isolation structures has a second width along the second direction, wherein a ratio of the first width to the second width is in a range from 1 to 4; and
   a super-junction doped structure in the drift region, and between the gate structure and the drain region, comprising:
   a plurality of first-conductive-type doped sub-regions extending along a third direction, disposed along the first direction and having the first conductive type; and
   a plurality of second-conductive-type doped sub-regions extending along the third direction, disposed along the first direction and having the second conductive type, wherein the plurality of first-conductive-type doped sub-regions and the plurality of second conductive doped sub-regions are alternately disposed;
   wherein widths of the plurality of first-conductive-type doped sub-regions along the first direction decrease from the gate structure to the drain region, wherein widths of the plurality of second-conductive-type doped sub-regions along the first direction decrease from the gate structure to the drain region.

2. The semiconductor device as claimed in claim 1, wherein the third direction is parallel to a normal direction of a top surface of the substrate structure.

3. The semiconductor device as claimed in claim 1, wherein the third direction is perpendicular to the first direction.

4. The semiconductor device as claimed in claim 1, wherein depths of the plurality of first-conductive-type doped sub-regions along the third direction decrease from the gate structure to the drain region, wherein depths of the plurality of second-conductive-type doped sub-regions along the third direction decrease from the gate structure to the drain region.

5. The semiconductor device as claimed in claim 1, wherein dopant concentrations of the plurality of first-conductive-type doped sub-regions decrease from the gate structure to the drain region, wherein dopant concentrations of the plurality of second-conductive-type doped sub-regions decrease from the gate structure to the drain region.

6. The semiconductor device as claimed in claim 1, wherein the substrate structure comprises:
   a semiconductor substrate having the first conductive type; and
   an epitaxial layer on the semiconductor substrate and having the second conductive type.

7. The semiconductor device as claimed in claim 6, wherein the bulk region is disposed in the epitaxial layer.

8. The semiconductor device as claimed in claim 1, wherein the plurality of first-conductive-type doped sub-regions at least comprise a first region of the first-conductive-type doped sub-region and a second region of the first-conductive-type doped sub-region adjacent to each other;
   wherein the first region of the first-conductive-type doped sub-region is closer to the gate structure than the second region of the first-conductive-type doped sub-region and has a third width along the first direction;
   wherein the second region of the first-conductive-type doped sub-region is closer to the drain region than the first region of the first-conductive-type doped sub-region and has a fourth width along the first direction;
   wherein a ratio of the fourth width to the third width is in a range from 0.9 to 0.7.

9. The semiconductor device as claimed in claim 1, wherein the second-conductive-type doped sub-regions at least comprise a first region of the second-conductive-type doped sub-region and a second region of the second-conductive-type doped sub-region adjacent to each other;
   wherein the first region of the second-conductive-type doped sub-region is closer to the gate structure than the second region of the second-conductive-type doped sub-region and has a fifth width along the first direction;
   wherein the second region of the second-conductive-type doped sub-region is closer to the drain region than the first region of the second-conductive-type doped sub-region and has a sixth width along the first direction;
wherein a ratio of the sixth width to the fifth width is in a range from 0.9 to 0.7.

10. The semiconductor device as claimed in claim 1, wherein the gate structure comprises:
a gate dielectric layer on the substrate structure; and
a gate electrode on the gate dielectric layer.

* * * * *